United States Patent
Kamimura

(10) Patent No.: US 12,282,259 B2
(45) Date of Patent: *Apr. 22, 2025

(54) LIQUID CHEMICAL, METHOD FOR PRODUCING LIQUID CHEMICAL, AND METHOD FOR ANALYZING TEST TARGET SOLUTION

(71) Applicant: FUJIFILM Corporation, Tokyo (JP)

(72) Inventor: Tetsuya Kamimura, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 451 days.

This patent is subject to a terminal disclaimer.

(21) Appl. No.: 16/924,859

(22) Filed: Jul. 9, 2020

(65) Prior Publication Data

US 2020/0341382 A1    Oct. 29, 2020

Related U.S. Application Data

(63) Continuation of application No. PCT/JP2019/000441, filed on Jan. 10, 2019.

(30) Foreign Application Priority Data

Jan. 12, 2018 (JP) ................................. 2018-003583

(51) Int. Cl.
| | |
|---|---|
| G03F 7/32 | (2006.01) |
| G01N 15/06 | (2006.01) |
| G01N 21/95 | (2006.01) |
| G03F 7/004 | (2006.01) |
| G03F 7/11 | (2006.01) |
| G01N 15/075 | (2024.01) |
| G03F 7/20 | (2006.01) |

(52) U.S. Cl.
CPC ............. *G03F 7/325* (2013.01); *G01N 15/06* (2013.01); *G01N 21/9505* (2013.01); *G03F 7/0048* (2013.01); *G03F 7/11* (2013.01); *G01N 15/075* (2024.01); *G03F 7/2006* (2013.01)

(58) Field of Classification Search
CPC ... G03F 7/325; G03F 7/32; G03F 7/42; G03F 7/0048
See application file for complete search history.

(56) References Cited

U.S. PATENT DOCUMENTS

| | | | | |
|---|---|---|---|---|
| 5,518,628 | A * | 5/1996 | Carey ...................... | B01J 47/04 |
| | | | | 210/686 |
| 2005/0016929 | A1 | 1/2005 | Kashkoush | |
| 2008/0213494 | A1* | 9/2008 | Kimura ................... | B05D 1/185 |
| | | | | 427/430.1 |
| 2012/0064456 | A1 | 3/2012 | Bae et al. | |
| 2014/0377175 | A1* | 12/2014 | Berlin ................. | A61K 49/0002 |
| | | | | 556/116 |
| 2015/0064625 | A1 | 3/2015 | Ogihara et al. | |
| 2015/0227049 | A1* | 8/2015 | Yamanaka ................ | G03F 7/32 |
| | | | | 206/524.2 |
| 2016/0336200 | A1 | 11/2016 | Jhuan et al. | |
| 2017/0176650 | A1* | 6/2017 | Govorov .................. | G02B 5/22 |
| 2019/0011827 | A1 | 1/2019 | Shimizu et al. | |
| 2019/0060782 | A1 | 2/2019 | Shimizu et al. | |
| 2019/0339619 | A1 | 11/2019 | Kamimura | |
| 2020/0206691 | A1* | 7/2020 | Jaber ........................ | B01J 47/12 |
| 2020/0319559 | A1* | 10/2020 | Kamimura ................ | G03F 7/11 |
| 2020/0341381 | A1* | 10/2020 | Kamimura ......... | B01D 39/2017 |

FOREIGN PATENT DOCUMENTS

| | | |
|---|---|---|
| JP | 2002-099076 A | 4/2002 |
| JP | 2015-049395 A | 3/2015 |
| JP | 2016-073922 A | 5/2016 |
| KR | 10-0869333 B1 | 11/2008 |
| TW | 556059 B | 11/2016 |
| WO | 2017/170428 A1 | 10/2017 |
| WO | 2017/188209 A1 | 11/2017 |
| WO | 2018/142888 A1 | 8/2018 |

OTHER PUBLICATIONS

International Search Report dated Mar. 12, 2019, issued by the International Searching Authority in application No. PCT/JP2019/000441.
Written Opinion dated Mar. 12, 2019, issued by the International Searching Authority in application No. PCT/JP2019/000441.
International Preliminary Report on Patentability dated Jul. 14, 2020, issued by the International Bureau in application No. PCT/JP2019/000441.
Notification of Reason for Refusal dated Mar. 21, 2022 from the Korean Intellectual Property Office in KR application No. 10-2020-7019414.
Office Action issued May 31, 2022 in Japanese Application No. 2019-564723.
Communication dated Sep. 7, 2021 from the Japanese Patent Office in Application No. 2019-564723.
Office Action dated Sep. 7, 2022 issued in Taiwanese Application No. 108101103.
Office Action issued Dec. 15, 2022 in Korean Application No. 10-2020-7019414.
Taiwanese Office Action dated Dec. 12, 2022 in Taiwanese Application No. 108101103.
Chinese Office Action dated Dec. 9, 2022 in Chinese Application No. 201980007846.9.

(Continued)

*Primary Examiner* — Daborah Chacko-Davis
(74) *Attorney, Agent, or Firm* — Sughrue Mion, PLLC

(57) ABSTRACT

An object is to provide a liquid chemical exhibiting excellent defect inhibitive performance even in a case of being applied to a resist process by KrF excimer laser exposure and ArF excimer laser exposure. Another object is to provide a method for analyzing a test target solution and a method for producing a liquid chemical.

A liquid chemical includes an organic solvent; and metal-containing particles containing a metal atom and having a particle size of 10 to 100 nm, in which the number of the metal-containing particles contained is $1.0 \times 10^{-2}$ to $1.0 \times 10^{12}$ particles/cm$^3$.

18 Claims, 1 Drawing Sheet

(56) References Cited

OTHER PUBLICATIONS

Office Action issued Jun. 26, 2023 in Korean Application No. 10-2020-7019414.
Communication dated Jun. 20, 2023 issued by the State Intellectual Property Office of the P.R. China in application No. 201980007846.9.
Office Action issued Aug. 7, 2023 in Taiwanese Application No. 108101103.
Office Action issued Feb. 19, 2025 in Taiwanese Patent Application No. 113138178.

* cited by examiner

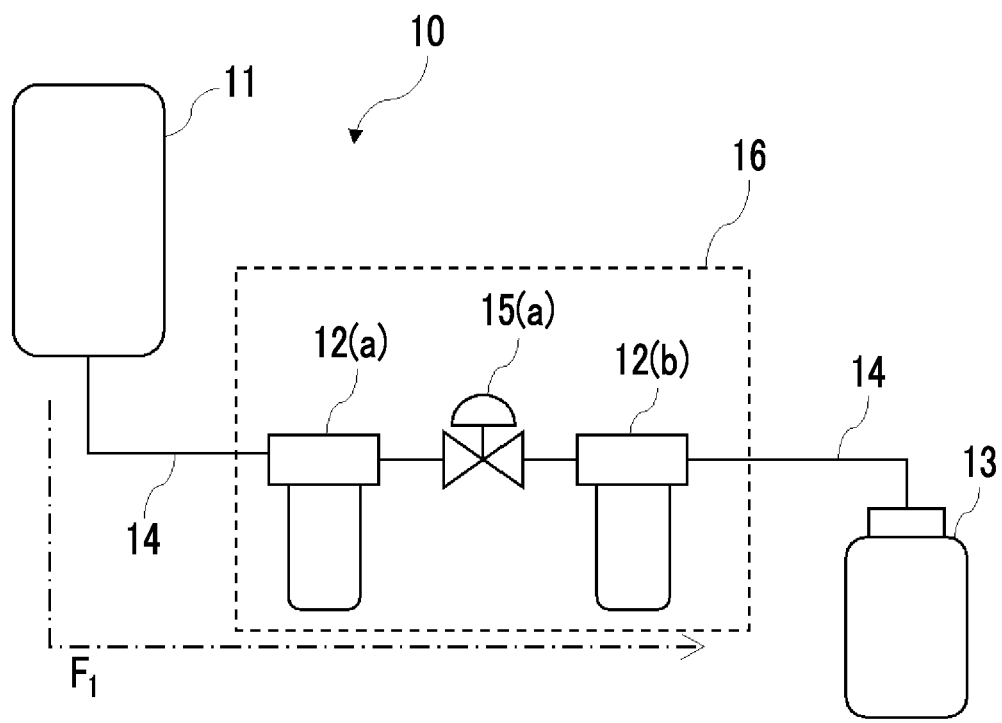

LIQUID CHEMICAL, METHOD FOR PRODUCING LIQUID CHEMICAL, AND METHOD FOR ANALYZING TEST TARGET SOLUTION

CROSS-REFERENCE TO RELATED APPLICATIONS

This application is a Continuation of PCT International Application No. PCT/JP2019/000441 filed on Jan. 10, 2019, which claims priority under 35 U.S.C. § 119(a) to Japanese Patent Application No. 2018-003583 filed on Jan. 12, 2018. The above application is hereby expressly incorporated by reference, in its entirety, into the present application.

BACKGROUND OF THE INVENTION

1. Field of the Invention

The present invention relates to a liquid chemical, a method for producing a liquid chemical, and a method for analyzing a test target solution.

2. Description of the Related Art

In a case of manufacturing a semiconductor device by a wiring forming step including photolithography, a liquid chemical containing water and/or an organic solvent is used as itself as a pre-wetting solution, a resist solution (a resist composition), a developer, a rinsing solution, a peeling solution, a slurry for chemical mechanical polishing (CMP), and a cleaning liquid or the like after CMP, or as a dilute solution therefor.

In recent years, miniaturization of patterns has been progressing in accordance with progress of photolithography technology. As a method of miniaturizing patterns, a method of shortening a wavelength of an exposure light source is used. Attempts have been made to form patterns using ultraviolet rays, a KrF excimer laser, an ArF excimer laser, and the like which were used in the related art as an exposure light source.

Development is in progress for the pattern formation by the KrF excimer laser, the ArF excimer laser, and the like while aiming at a resist pattern line and/or space width of 20 to 80 nm, and the above-mentioned liquid chemical used in this process is required to further exhibit defect inhibitive performance. The defect inhibitive performance refers to performance that hardly allows defects to be generated in a semiconductor substrate in a case where the semiconductor substrate is treated with a liquid chemical in a step of manufacturing a semiconductor device.

As a method for producing a liquid chemical used in resist pattern formation of the related art, JP2015-049395A discloses "a method for producing a resist composition used in a step of manufacturing a semiconductor device, the method including: cleaning a manufacturing device for a resist composition with a cleaning liquid; removing the cleaning liquid from the manufacturing device to be spin-applied to a substrate for evaluation; cleaning the substrate for evaluation until changes in defect density of defects having a size of 100 nm or more in the substrate for evaluation before and after application become 0.2 defects/cm$^2$ or less; and thereafter, producing a resist composition by the manufacturing device." JP2015-049395A discloses that pattern defects and the like were inhibited in a case where ArF exposure was performed using a liquid chemical (resist composition) produced by this method.

SUMMARY OF THE INVENTION

The inventors of the present invention have found that defects are not necessarily sufficiently inhibited in a case where patterns are formed by KrF excimer laser exposure and ArF excimer laser exposure using a resist composition containing a liquid chemical produced by the above production method.

Accordingly, an object of the present invention is to provide a liquid chemical from which defects are hardly generated even in a case where the liquid chemical is applied to a resist process by KrF excimer laser exposure and ArF excimer laser exposure, in other words, a liquid chemical exhibiting excellent defect inhibitive performance even in a case of being applied to a resist process by KrF excimer laser exposure and ArF excimer laser exposure.

Another object of the present invention is to provide a method for analyzing a test target solution and a method for producing a liquid chemical.

The inventors of the present invention have conducted intensive studies to achieve the above-mentioned objects, and as a result, they have found that the above-mentioned objects can be achieved by the following configurations.

[1] A liquid chemical comprising: an organic solvent; and metal-containing particles containing a metal atom and having a particle size of 10 to 100 nm, in which the number of the metal-containing particles contained is $1.0 \times 10^{-2}$ to $1.0 \times 10^{12}$ particles/cm$^3$.

[2] The liquid chemical according to [1], which is used for manufacturing a semiconductor device.

[3] The liquid chemical according to [1] or [2], in which the metal-containing particles consist of at least one selected from the group consisting of particles A consisting of a simple substance of the metal atom, particles B consisting of an oxide of the metal atom, and particles C consisting of a simple substance of the metal atom and an oxide of the metal atom.

[4] The liquid chemical according to [3], in which the particles C have a simple substance of the metal atom and have an oxide of the metal atom which is disposed to cover at least a part of a surface of the simple substance of the metal atom.

[5] The liquid chemical according to [3] or [4], in which a ratio of the number of the particles C contained to the number of the particles B contained is 1.0 or more, based on the number of the particles per unit volume of the liquid chemical.

[6] The liquid chemical according to any one of [3] to [5], in which a ratio of the number of the particles A contained to a total of the number of the particles B contained and the number of the particles C contained is less than 1.0, based on the number of the particles per unit volume of the liquid chemical.

[7] The liquid chemical according to any one of [3] to [6], in which a ratio of the number of the particles A contained to a total of the number of the particles B contained and the number of the particles C contained is $1.0 \times 10^{-1}$ or less, based on the number of the particles per unit volume of the liquid chemical.

[8] The liquid chemical according to any one of [3] to [7], in which the particles A consist of particles E consisting of one kind of the metal atom, and particles F consisting of two or more kinds of metal atoms, and a ratio of the number of the particles E contained to the number of the particles F contained is $1.0 \times 10^{-2}$ to $1.0 \times 10^2$, based on the number of the particles per unit volume of the liquid chemical.

[9] The liquid chemical according to any one of [1] to [8], further comprising an organic compound having a boiling point of 300° C. or higher.

[10] The liquid chemical according to [9], in which at least some of the metal-containing particles are particles U containing the organic compound.

[11] The liquid chemical according to [9] or [10], in which at least some of the metal-containing particles are the particles U containing the organic compound and particles V not containing the organic compound, and a ratio of the number of the particles U contained to the number of the particles V contained is $1.0 \times 10^1$ or more, based on the number of the particles per unit volume of the liquid chemical.

[12] The liquid chemical according to [10] or [11], in which the number of the particles U contained per unit volume of the liquid chemical is $5.0 \times 10^{-2}$ to $1.0 \times 10^{11}$ particles/cm$^3$.

[13] The liquid chemical according to any one of [1] to [12], in which at least some of the metal-containing particles are at least one selected from the group consisting of Pb-containing particles containing a Pb atom and Ti-containing particles containing a Ti atom.

[14] The liquid chemical according to any one of [1] to [13], in which at least some of the metal-containing particles are Pb-containing particles containing a Pb atom and Ti-containing particles containing a Ti atom, and a ratio of the number of the Pb-containing particles contained to the number of the Ti-containing particles contained is $1.0 \times 10^{-5}$ to 1.0, based on the number of the particles per unit volume of the liquid chemical.

[15] A method for producing a liquid chemical, which is for producing the liquid chemical according to any one of [1] to [14], the method comprising a filtration step of filtering a purification target substance containing an organic solvent using a filter to obtain the liquid chemical.

[16] The method for producing a liquid chemical according to [15], the method further comprising a distillation step of distilling the purification target substance to obtain a distilled purification target substance prior to the filtration step, in which the purification target substance contains an organic compound having a boiling point of 300° C. or higher, and a content of the organic compound in the distilled purification target substance is $1.0 \times 10^{-3}$ mass ppt to $1.0 \times 10^3$ mass ppm.

[17] The method for producing a liquid chemical according to [15] or [16], in which the filtration step is a multi-stage filtration step in which the purification target substance is passed through two or more kinds of filters different in at least one selected from the group consisting of a filter material, a pore diameter, and a pore structure.

[18] The method for producing a liquid chemical according to any one of [15] to [17], in which, for the filter, in a case of using one filter, a pore diameter of the filter is 5 nm or smaller, and in a case of using two or more filters, a pore diameter of a filter having a smallest pore diameter among the filters is 5 nm or smaller.

[19] A method for analyzing a test target solution, the method comprising, in this order: a step A of applying a test target solution to a substrate to form a test target solution layer on the substrate, the test target solution containing an organic solvent and metal-containing particles containing a metal atom and having a particle size of 10 to 100 nm; and a step B of analyzing the number of the metal-containing particles per unit area of the substrate.

According to the present invention, it is possible to provide a liquid chemical exhibiting excellent defect inhibitive performance even in a case of being applied to a resist process by KrF excimer laser exposure and ArF excimer laser exposure. In addition, according to the present invention, it is possible to further provide a method for analyzing a test target solution and a method for producing a liquid chemical.

BRIEF DESCRIPTION OF THE DRAWINGS

FIG. 1 is a schematic diagram showing a typical example of a purification device with which a multi-stage filtration step can be performed.

DESCRIPTION OF THE PREFERRED EMBODIMENTS

Hereinafter, the present invention will be described in detail.

The description of constituent elements described below can be made based on representative embodiments of the present invention, but the present invention is not limited to such embodiments.

Numerical value ranges expressed using "to" in the present specification mean a range including numerical values described before and after "to" as the lower limit value and the upper limit value.

In addition, in the present invention, "ppm" means "parts-per-million ($10^{-6}$)," "ppb" means "parts-per-billion ($10^{-9}$)," "ppt" means "parts-per-trillion ($10^{-12}$)," and "ppq" means "parts-per-quadrillion ($10^{-15}$)."

Furthermore, in the indication of a group (atomic group) in the present invention, the indication not including substitution or unsubstitution includes those having a substituent and also those not having a substituent within a range not impairing effects of the present invention. For example, a "hydrocarbon group" refers to not only a hydrocarbon group not having a substituent (unsubstituted hydrocarbon group) but also a hydrocarbon group having a substituent (substituted hydrocarbon group). This also applies to each compound.

[Liquid Chemical]

A liquid chemical according to the embodiment of the present invention (hereinafter, also referred to as a "present liquid chemical") is a liquid chemical including an organic solvent, and metal-containing particles containing a metal atom and having a particle size of 10 to 100 nm, in which the number of the metal-containing particles contained per unit volume of the liquid chemical is $1.0 \times 10^{-2}$ to $1.0 \times 10^{12}$ particles/cm$^3$.

Although the mechanism by which the above-mentioned objects are achieved by the present liquid chemical is not necessarily clarified, the inventors of the present invention presume the mechanism as follows. The following mechanism is presumption, and even in a case where effects of the present invention are obtained by a different mechanism, this is included in the scope of the present invention.

The present liquid chemical is characterized in that, among the metal-containing particles, the number of the metal-containing particles contained, which have a particle size of 10 to 100 nm, is controlled to $1.0 \times 10^{-2}$ to $1.0 \times 10^{12}$ particles/cm$^3$ in the liquid chemical.

In a process using KrF excimer laser exposure and ArF excimer laser exposure, there is a demand for narrowing a pattern space and a pattern width of a resist, and a pitch of a pattern which is obtained by totalling one pattern width and one pattern space and in which these pattern width and space are periodically arranged; and a space and a width of a manufactured wiring, and a pitch of a wiring which is obtained by totalling one wiring width and one wiring space and in which these wiring width and space are periodically arranged.

Specifically, in many cases, a pattern width or a pattern space is about 20 to 80 nm (a pitch is about 40 to 160 nm). In such a case, the inventors of the present invention have found that controlling of finer particles by unit of the number of particles is required, which has not been a problem in a process of the related art.

It is presumed that, among the above-mentioned particles, particles having a particle size of smaller than 10 nm aggregate more easily in a case where the liquid chemical is applied to a substrate, and as a result, coarse particles are formed in many cases. It is presumed that, for this reason, these particles are removed (for example, in a form of being washed away) during a photoresist process in many cases, and therefore an influence of these particles on defect inhibitive performance of the liquid chemical is not so large.

Meanwhile, among the above-mentioned particles, because particles having a particle size of 100 nm or larger are sufficiently large as compared to a required pattern space and resist pitch, these particles are removed during a process as described above. Accordingly, it is presumed that an influence of these particles on defect inhibitive performance of the liquid chemical is not so large.

It is presumed that the metal-containing particles having a particle size of 10 to 100 nm have a greater influence on defect inhibitive performance of the liquid chemical. In particular, in a process using KrF excimer laser exposure and ArF excimer laser exposure, a required pattern width or pattern space is about 20 to 80 nm, and it is presumed that metal-containing particles having a particle size of 10 to 100 nm have a particularly great influence on defect inhibitive performance of the liquid chemical.

In the liquid chemical of the embodiment of the present invention, the number of the metal-containing particles contained per unit volume of the liquid chemical is $1.0 \times 10^{-2}$ particles/cm$^3$ or more, and therefore it is presumed that the metal-containing particles easily aggregate with each other and thereby are easily removed during a process, and as a result, the liquid chemical exhibits excellent defect inhibitive performance.

Meanwhile, in the liquid chemical of the embodiment of the present invention, the number of the metal-containing particles contained per unit volume of the liquid chemical is $1.0 \times 10^{12}$ particles/cm$^3$ or less, and therefore it is presumed that the metal-containing particles themselves are inhibited from becoming a cause of defects, and as a result, the liquid chemical exhibits excellent defect inhibitive performance.

[Organic Solvent]

The liquid chemical includes the organic solvent. A content of the organic solvent in the liquid chemical is not particularly limited, but in general, it is preferably 98.0% by mass or more, more preferably 99.0% by mass or more, even more preferably 99.9% by mass or more, and particularly preferably 99.99% by mass or more with respect to a total mass of the liquid chemical. The upper limit thereof is not particularly limited but is less than 100% by mass in many cases.

As the organic solvent, one kind thereof may be used alone, or two or more kinds thereof may be used in combination. In a case where two or more kinds of organic solvents are used in combination, a total content thereof is preferably within the above-mentioned range.

In the present specification, the organic solvent means a liquid organic compound contained at a content of more than 10,000 ppm by mass per component with respect to a total mass of the liquid chemical. That is, in the present specification, a liquid organic compound contained at a content of more than 10,000 ppm by mass with respect to a total mass of the liquid chemical corresponds to the organic solvent.

In the present specification, the term "liquid" means a substance that is liquid at 25° C. and atmospheric pressure.

The type of the organic solvent is not particularly limited, and known organic solvents can be used. Examples of organic solvents include alkylene glycol monoalkyl ether carboxylate, alkylene glycol monoalkyl ether, lactic acid ethyl ester, alkyl alkoxypropionate, cyclic lactone (preferably having 4 to 10 carbon atoms), a monoketone compound (preferably having 4 to 10 carbon atoms) which may have a ring, alkylene carbonate, alkyl alkoxyacetate, alkyl pyruvate, and the like.

As the organic solvent, for example, those disclosed in JP2016-057614A, JP2014-219664A, JP2016-138219A, and JP2015-135379A may be used.

As the organic solvent, at least one selected from the group consisting of propylene glycol monomethyl ether, propylene glycol monoethyl ether (PGME), propylene glycol monopropyl ether, propylene glycol monomethyl ether acetate (PGMEA), ethyl lactate (EL), methyl methoxypropionate, cyclopentanone, cyclohexanone (CHN), γ-butyrolactone, diisoamyl ether, butyl acetate (nBA), isoamyl acetate, isopropanol, 4-methyl-2-pentanol, dimethyl sulfoxide, N-methyl-2-pyrrolidone, diethylene glycol, ethylene glycol, dipropylene glycol, propylene glycol, ethylene carbonate, propylene carbonate (PC), sulfolane, cycloheptanone, 1-hexanol, decane, and 2-heptanone is preferable. Among the above examples, CHN, PGMEA, PGME, nBA, PC, and a mixture thereof are preferable from the viewpoint that then, it is possible to obtain a liquid chemical exhibiting more excellent effects of the present invention.

As the organic solvent, one kind thereof may be used alone, or two or more kinds thereof may be used in combination.

The type and a content of the organic solvent in the liquid chemical can be measured using a gas chromatography mass spectrometer.

[Metal-Containing Particles]

The present liquid chemical includes metal-containing particles containing a metal atom and having a particle size of 10 to 100 nm.

A preferable embodiment of a method for producing the present liquid chemical will be described later. Generally, the present liquid chemical can be produced by purifying a purification target substance containing the above-described organic solvent and impurities. The metal-containing particles may be intentionally added in a step of producing the liquid chemical, may be originally contained in a purification target substance, or may be transferred (so-called contamination) from a production device or the like for the liquid chemical in a step of producing the liquid chemical.

A metal atom is not particularly limited, and examples thereof include an Fe atom, an Al atom, a Cr atom, a Ni atom, a Pb atom, a Zn atom, a Ti atom, and the like. In a case of controlling, within the above range, the number of the metal-containing particles contained which contain at least one selected from the group consisting of an Fe atom, an Al atom, a Pb atom, a Zn atom, and a Ti atom among the above examples, more excellent defect inhibitive performance is easily obtained. In a case of controlling, within the above range, the number of the metal-containing particles contained which contain at least one selected from the group consisting of a Pb atom and a Ti atom among the above examples, further more excellent defect inhibitive performance is easily obtained.

That is, as the metal atom, at least one selected from the group consisting of an Fe atom, an Al atom, a Cr atom, a Ni atom, a Pb atom, a Zn atom, and a Ti atom is preferable; at least one selected from the group consisting of an Fe atom, an Al atom, a Pb atom, a Zn atom, and a Ti atom is more preferable; and at least one selected from the group consisting of a Pb atom and a Ti atom is even more preferable. It is particularly preferable that the liquid chemical include both metal-containing particles containing a Pb atom and metal-containing particles containing a Ti atom.

The metal-containing particles may contain one kind of the above metal atoms alone or may contain two or more kinds thereof in combination.

A particle size of the metal-containing particles is 10 to 100 nm. According to the study of the inventors of the present invention, it was found that a liquid chemical exhibiting excellent defect inhibitive performance is easily obtained by controlling the number of the metal-containing particles contained, which have a particle size of 10 to 100 nm, in the liquid chemical, particularly in a liquid chemical applied to a photoresist process by ArF excimer laser exposure. As described above, a fine pattern width and/or space width of 20 to 80 nm is required in many cases in a photoresist process of KrF excimer laser exposure and ArF excimer laser exposure. In such a case, controlling of finer particles by unit of the number of particles is required, which has not been a problem in a process of the related art.

The number of the metal-containing particles contained per unit volume of the liquid chemical is $1.0 \times 10^{-2}$ to $1.0 \times 10^{12}$ particles/cm$^3$. The number of the particles contained is preferably $1.0 \times 10^{-1}$ particles/cm$^3$ or more and is more preferably 1.0 particles/cm$^3$ or more; and is preferably $5.0 \times 10^{11}$ particles/cm$^3$ or less, is more preferably less than $1.0 \times 10^{11}$ particles/cm$^3$, and is even more preferably $3.5 \times 10^{10}$ particles/cm$^3$ or less, from the viewpoint that then, the present liquid chemical exhibits more excellent effects of the present invention.

In a case where the number of the metal-containing particles contained per unit volume of the liquid chemical is 1.0 to $3.5 \times 10^{10}$ particles/cm$^3$, the liquid chemical exhibits more excellent defect inhibitive performance.

A ratio (Pb/Ti) of the number of Pb-containing particles containing a Pb atom to the number of Ti-containing particles containing a Ti atom in the liquid chemical is not particularly limited, but in general, it is preferably $1.0 \times 10^{-6}$ to 3.0 and is more preferably $1.0 \times 10^{-5}$ to 1.0.

The lower limit value is even more preferably $1.0 \times 10^{-4}$ or more, particularly preferably $1.0 \times 10^{-3}$ or more, most preferably $1.0 \times 10^{-2}$ or more, and further most preferably $1.0 \times 10^{-1}$ or more.

In a case where Pb/Ti is $1.0 \times 10^{-5}$ to 1.0, the liquid chemical exhibits more excellent effects of the present invention, particularly, more excellent bridge defect inhibitive performance.

The inventors of the present invention have found that the Pb nanoparticles and Ti nanoparticles easily associate with each other and easily become a cause of defects (particularly, a cause of bridge defects) in a case of developing a resist film.

It is alarming that generation of defects is more easily inhibited in a case where Pb/Ti is $1.0 \times 10^{-5}$ to 1.0.

In the present specification, a content (the number of particles) of the metal-containing particles per unit volume of the liquid chemical is measured by a method described in Examples, and the value is rounded off to two significant figures.

As long as the metal-containing particles contain a metal atom, a form thereof is not particularly limited. Examples of forms include a simple substance of a metal atom, a compound containing a metal atom (hereinafter, also referred to as a "metallic compound"), a complex thereof, and the like. In addition, the metal-containing particles may contain a plurality of metal atoms. In a case where the metal nanoparticles contain a plurality of metal atoms, a metal atom contained by the largest content (atm %) among the plurality of metal atoms is used as a main component. Accordingly, in a case of referring to the "Pb-containing particles," this means that a Pb atom is a main component among a plurality of metal atoms in a case where a plurality of metal atoms are contained.

The complex is not particularly limited, and examples thereof include a so-called core-shell type particles having a simple substance of a metal atom, and a metallic compound that covers at least a part of the above-mentioned simple substance of the metal atom; solid solution particles containing a metal atom and other atoms; eutectic particles containing a metal atom and other atoms; aggregate particles of a simple substance of a metal atom and a metallic compound; aggregate particles of different types of metallic compounds; a metallic compound of which a composition changes continuously or intermittently from a particle surface toward the center; and the like.

The atom other than a metal atom contained in a metallic compound is not particularly limited, and examples thereof include a carbon atom, an oxygen atom, a nitrogen atom, a hydrogen atom, a sulfur atom, a phosphorus atom, and the like. Among the examples, an oxygen atom is preferable. A form of incorporating an oxygen atom to a metallic compound is not particularly limited, but an oxide of a metal atom is more preferable.

Preferable Embodiment 1 of Metal-Containing Particles

Among the particles, the metal-containing particles preferably consist of at least one selected from the group consisting of particles A consisting of a simple substance of the metal atom, particles B consisting of an oxide of the metal atom, and particles C consisting of a simple substance of the metal atom and an oxide of the metal atom, from the viewpoint that then, it is possible to obtain a liquid chemical exhibiting more excellent effects of the present invention.

As a form of the particles C, particles C, which have a simple substance of the metal atom and have an oxide of the metal atom which is disposed to cover at least a part of a surface of the simple substance of the metal atom, are preferable.

A ratio (B/C) of the number of the particles C contained to the number of the particles B contained per unit volume of the liquid chemical is not particularly limited, but it is preferably 1.0 or more and more preferably 1.1 or more from the viewpoint that then, the liquid chemical exhibits more excellent effects of the present invention. The upper limit value is not particularly limited, but in general, it is preferably $1.0 \times 10^1$ or less and more preferably 5.0 or less. In a case where a B/C is within the above range, the liquid chemical exhibits more excellent bridge defect inhibitive performance.

In addition, a ratio (hereinafter, also referred to as "A/(B+C)") of the number of the particles A contained to a total of the number of the particles B contained and the number of the particles C contained per unit volume of the liquid chemical is not particularly limited, but it is preferably less than 1.0 and more preferably $1.0 \times 10^{-1}$ or less from the viewpoint that then, the liquid chemical exhibits more excellent effects of the present invention. The lower limit value is not particularly limited, but in general, it is preferably $1.0 \times 10^{-2}$ or more. In a case where A/(B+C) is within the above range, the liquid chemical exhibits more excellent defect inhibitive performance particularly in a case where the liquid chemical is used as a pre-wetting solution and/or a developer. Although the reason for this is not necessarily clear, it is presumed that the particles B and C are more hydrophilic than the particles A, and thus the particles B and C are less likely to remain on a substrate (are unlikely to cause residue defects) due to a relationship with a resist film that is water-repellent in many cases.

Preferable Embodiment 2 of Metal-Containing Particles

In addition, the metal-containing particles preferably contain particles E consisting of one kind of metal atom, and particles F consisting of two or more kinds of metal atoms, from the viewpoint that then, a liquid chemical exhibiting more excellent effects of the present invention is obtained.

A ratio (E/F) of the number of the particles E contained to the number of the particles F contained per unit volume of the liquid chemical is not particularly limited, but it is preferably $1.0 \times 10^{-3}$ to $1.0 \times 10^{3}$, more preferably $1.0 \times 10^{-2}$ to $1.0 \times 10^{2}$, and even more preferably $1.0 \times 10^{-2}$ to $9.0 \times 10^{1}$. In a case where E/F is $1.0 \times 10^{-2}$ to $1.0 \times 10^{2}$, the liquid chemical exhibits more excellent bridge defect inhibitive performance.

[Other Components]

The liquid chemical may include other components other than the above-described components. Examples of other components include organic compounds other than the organic solvent (particularly, an organic compound having a boiling point of 300° C. or higher), water, resins, and the like.

<Organic Compound Other than Organic Solvent>

The liquid chemical may include an organic compound other than the organic solvent (hereinafter, also referred to as a "specific organic compound"). In the present specification, the specific organic compound is a compound different from the organic solvent contained in the liquid chemical, and means an organic compound contained at a content of 10,000 mass ppm or less with respect to a total mass of the liquid chemical. That is, in the present specification, the organic compound contained at a content of 10,000 ppm by mass or less with respect to a total mass of the liquid chemical corresponds to the specific organic compound and does not correspond to the organic solvent.

In a case where a plurality of types of organic compounds are contained in the liquid chemical, and in a case where each of the organic compounds is contained at the above-mentioned content of 10,000 mass ppm or less, the respective organic compounds correspond to the specific organic compound.

The specific organic compound may be added to the liquid chemical or may be unintentionally mixed in a step of producing the liquid chemical. Examples of cases in which the specific organic compound is unintentionally mixed in a step of producing the liquid chemical include a case in which the specific organic compound is contained in a raw material (for example, an organic solvent) used for producing the liquid chemical, a case in which the specific organic compound is mixed (for example, contamination) in a step of producing the liquid chemical, and the like, but examples are not limited thereto.

A content of the specific organic compound in the liquid chemical can be measured using gas chromatography mass spectrometer (GCMS).

The number of carbon atoms of the specific organic compound is not particularly limited, but it is preferably 8 or more and more preferably 12 or more from the viewpoint that then, the liquid chemical exhibits more excellent effects of the present invention. The upper limit of the number of carbon atoms is not particularly limited, but in general, it is preferably 30 or less.

The specific organic compound may be, for example, a by-product generated due to synthesis of the organic solvent and/or an unreacted raw material (hereinafter, also referred to as "by-product and the like"), and the like.

Examples of by-products and the like include compounds represented by Formulas I to V.

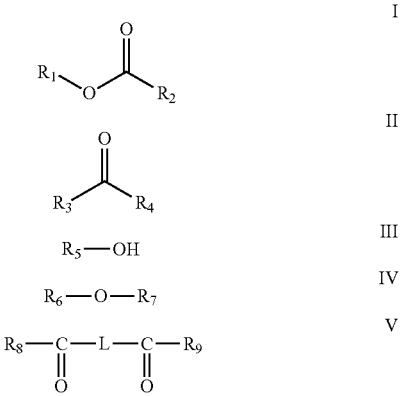

In Formula I, $R_1$ and $R_2$ each independently represent an alkyl group or a cycloalkyl group, or are bonded to each other to form a ring.

As an alkyl group or a cycloalkyl group represented by $R_1$ and $R_2$, an alkyl group having 1 to 12 carbon atoms or a cycloalkyl group having 6 to 12 carbon atoms is preferable, and an alkyl group having 1 to 8 carbon atoms or a cycloalkyl group having 6 to 8 carbon atoms is more preferable.

A ring to be formed by bonding of $R_1$ and $R_2$ to each other is a lactone ring, is preferably a 4- to 9-membered lactone ring, and is more preferably a 4- to 6-membered lactone ring.

$R_1$ and $R_2$ preferably satisfy a relationship in which the compound represented by Formula I has 8 or more carbon atoms.

In Formula II, $R_3$ and $R_4$ each independently represent a hydrogen atom, an alkyl group, an alkenyl group, a cycloalkyl group, or a cycloalkenyl group, or are bonded to each other to form a ring. Where not both $R_3$ and $R_4$ are hydrogen atoms.

As an alkyl group represented by $R_3$ and $R_4$, for example, an alkyl group having 1 to 12 carbon atoms is preferable, and an alkyl group having 1 to 8 carbon atoms is more preferable.

As an alkenyl group represented by $R_3$ and $R_4$, for example, an alkenyl group having 2 to 12 carbon atoms is preferable, and an alkenyl group having 2 to 8 carbon atoms is more preferable.

As a cycloalkyl group represented by $R_3$ and $R_4$, a cycloalkyl group having 6 to 12 carbon atoms is preferable, and a cycloalkyl group having 6 to 8 carbon atoms is more preferable.

As a cycloalkenyl group represented by $R_3$ and $R_4$, for example, a cycloalkenyl group having 3 to 12 carbon atoms is preferable, and a cycloalkenyl group having 6 to 8 carbon atoms is more preferable.

A ring to be formed by bonding of $R_3$ and $R_4$ to each other has a cyclic ketone structure, and it may be a saturated cyclic ketone or an unsaturated cyclic ketone. This cyclic ketone is preferably a 6- to 10-membered ring and more preferably a 6- to 8-membered ring.

$R_3$ and $R_4$ preferably satisfy a relationship in which the compound represented by Formula II has 8 or more carbon atoms.

In Formula III, $R_5$ represents an alkyl group or a cycloalkyl group.

An alkyl group represented by $R_5$ is preferably an alkyl group having 6 or more carbon atoms, more preferably an alkyl group having 6 to 12 carbon atoms, and even more preferably an alkyl group having 6 to 10 carbon atoms.

The alkyl group may have an ether bond in a chain, or may have a substituent such as a hydroxy group.

A cycloalkyl group represented by $R_5$ is preferably a cycloalkyl group having 6 or more carbon atoms, more preferably a cycloalkyl group having 6 to 12 carbon atoms, and even more preferably a cycloalkyl group having 6 to 10 carbon atoms.

In Formula IV, $R_6$ and $R_7$ each independently represent an alkyl group or a cycloalkyl group, or are bonded to each other to form a ring.

As an alkyl group represented by $R_6$ and $R_7$, an alkyl group having 1 to 12 carbon atoms is preferable, and an alkyl group having 1 to 8 carbon atoms is more preferable.

As a cycloalkyl group represented by $R_6$ and $R_7$, a cycloalkyl group having 6 to 12 carbon atoms is preferable, and a cycloalkyl group having 6 to 8 carbon atoms is more preferable.

A ring to be formed by bonding of $R_6$ and $R_7$ to each other has a cyclic ether structure. This cyclic ether structure is preferably a 4- to 8-membered ring and more preferably a 5- to 7-membered ring.

$R_6$ and $R_7$ preferably satisfy a relationship in which the compound represented by Formula IV has 8 or more carbon atoms.

In Formula V, $R_8$ and $R_9$ each independently represent an alkyl group or a cycloalkyl group, or are bonded to each other to form a ring. L represents a single bond or an alkylene group.

As an alkyl group represented by $R_8$ and $R_9$, for example, an alkyl group having 6 to 12 carbon atoms is preferable, and an alkyl group having 6 to 10 carbon atoms is more preferable.

As a cycloalkyl group represented by $R_8$ and $R_9$, a cycloalkyl group having 6 to 12 carbon atoms is preferable, and a cycloalkyl group having 6 to 10 carbon atoms is more preferable.

A ring to be formed by bonding of $R_8$ and $R_9$ to each other has a cyclic diketone structure. This cyclic diketone structure is preferably a 6- to 12-membered ring and more preferably a 6- to 10-membered ring.

As an alkylene group represented by L, for example, an alkylene group having 1 to 12 carbon atoms is preferable, and an alkylene group having 1 to 10 carbon atoms is more preferable.

$R_8$, $R_9$, and L satisfy a relationship in which the compound represented by Formula V has 8 or more carbon atoms.

Although not particularly limited, in a case where the organic solvent is an amide compound, an imide compound, and a sulfoxide compound, in one aspect, an amide compound, an imide compound, and a sulfoxide compound which have 6 or more carbon atoms are used. In addition, examples of specific organic compounds include the following compounds.

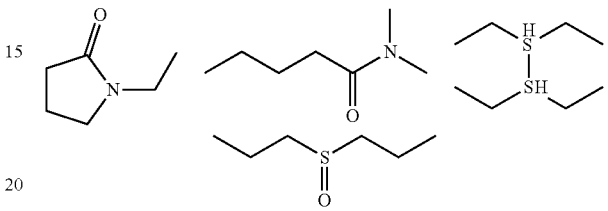

In addition, examples of specific organic compounds include antioxidants such as dibutylhydroxytoluene (BHT), distearyl thiodipropionate (DSTP), 4,4'-butylidenebis-(6-t-butyl-3-methylphenol), 2,2'-methylenebis-(4-ethyl-6-t-butylphenol), and an antioxidant disclosed in JP2015-200775A; unreacted raw materials; structural isomers and by-products produced during production of organic solvents; eluted substances (for example, a plasticizer eluted from a rubber member such as an O-ring) from members and the like constituting a production device for organic solvents; and the like.

Furthermore, examples of specific organic compounds include dioctyl phthalate (DOP), bis(2-ethylhexyl) phthalate (DEHP), bis(2-propylheptyl) phthalate (DPHP), dibutyl phthalate (DBP), benzyl butyl phthalate (BBzP), diisodecyl phthalate (DIDP), diisooctyl phthalate (DIOP), diethyl phthalate (DEP), diisobutyl phthalate (DIBP), dihexyl phthalate, diisononyl phthalate (DINP), tris(2-ethylhexyl) trimellitate (TEHTM), tris(n-octyl-n-decyl) trimellitate (ATM), bis(2-ethylhexyl) adipate (DEHA), monomethyl adipate (MMAD), dioctyl adipate (DOA), dibutyl sebacate (DBS), dibutyl maleate (DBM), diisobutyl maleate (DIBM), azelaic acid ester, benzoic acid ester, terephthalate (for example, dioctyl terephthalate (DEHT)), 1,2-cyclohexane dicarboxylic acid diisononyl ester (DINCH), epoxidized vegetable oils, sulfonamide (for example, N-(2-hydroxypropyl)benzenesulfonamide (HPBSA), N-(n-butyl)benzenesulfonamide (BBSA-NBBS)), organophosphate ester (for example, tricresyl phosphate (TCP), tributyl phosphate (TBP)), acetylated monoglyceride, triethyl citrate (TEC), acetyl triethyl citrate (ATEC), tributyl citrate (TBC), acetyl tributyl citrate (ATBC), trioctyl citrate (TOC), trioctyl acetyl citrate (ATOC), trihexyl citrate (THC), acetyl trihexyl citrate (ATHC), epoxidized soybean oil, ethylene propylene rubber, polybutene, an addition polymer of 5-ethylidene-2-norbornene, and polymer plasticizers exemplified below.

It is presumed that these specific organic compounds are mixed into a purification target substance or the liquid chemical from a filter, a pipe, a tank, an O-ring, a container, or the like which comes into contact therewith in a purification step. In particular, compounds other than alkyl olefins are associated generation of bridge defects.

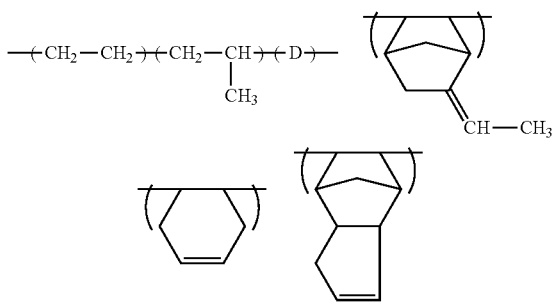

(Organic Compound having Boiling Point of 300° C. or Higher)

The liquid chemical may include an organic compound having a boiling point of 300° C. or higher (a high-boiling point organic compound). In a case where the liquid chemical includes the organic compound having a boiling point of 300° C. or higher, it hardly volatilizes during a photolithography process because of a high boiling point. For this reason, it is necessary to strictly control a content, an existence form thereof, and the like of a high-boiling point organic compound in the liquid chemical to obtain a liquid chemical exhibiting excellent defect inhibitive performance.

As such high-boiling point organic compounds, for example, dioctyl phthalate (a boiling point of 385° C.), diisononyl phthalate (a boiling point of 403° C.), dioctyl adipate (a boiling point of 335° C.), dibutyl phthalate (a boiling point of 340° C.), ethylene propylene rubber (a boiling point of 300° C. to 450° C.), and the like have been confirmed.

The inventors of the present invention have found that there are various forms in a case where a high-boiling point organic compound is contained in the liquid chemical. Examples of existence forms of the high-boiling point organic compound in the liquid chemical include particles in which particles consisting of a metal atom or a metallic compound are aggregate with particles of a high-boiling point organic compound; particles in which particles consisting of a metal atom or a metallic compound, and a high-boiling point organic compound disposed to cover at least a part of the particles are included; particles formed by coordination bonding between a metal atom and a high-boiling point organic compound; and the like.

Preferable Embodiment 3 of Metal-Containing Particles

In addition, an aspect is also preferable in which at least some of the metal-containing particles are particles U containing an organic compound (preferably, a high-boiling point organic compound), and particles V not containing an organic compound (preferably, a high-boiling point organic compound), from the viewpoint that then, a liquid chemical exhibiting more excellent effects of the present invention is obtained.

In this case, a ratio (U/V) of the number of the particles U contained to the number of the particles V contained per unit volume of the liquid chemical is not particularly limited, but it is preferably 1.0 or more and more preferably $1.0 \times 10^1$ or more from the viewpoint that then, a liquid chemical exhibiting more excellent effects of the present invention is obtained. The upper limit value is not particularly limited, but in general, it is preferably 50 or less.

In a case where U/V is within the above range, the liquid chemical exhibits more excellent defect inhibitive performance. Although the reason for this is not necessarily clear, it is presumed that the particles U are more easily removed as compared with the particles V, and thus the particles U are further unlikely to remain on a resist film, particularly in a case in which the liquid chemical is used as a developer.

<Water>

The liquid chemical may include water. Water is not particularly limited, and for example, distilled water, ion exchange water, pure water, and the like can be used. Water is not included in the above-mentioned organic impurities.

Water may be added to the liquid chemical or may be unintentionally mixed into the liquid chemical in a step of producing the liquid chemical. Examples of cases in which water is unintentionally mixed in a step of producing the liquid chemical include a case in which water is contained in a raw material (for example, an organic solvent) used for producing the liquid chemical, a case in which water is mixed (for example, contamination) in a step of producing the liquid chemical, and the like, but examples are not limited thereto.

A content of water in the liquid chemical is not particularly limited, but in general, it is preferably 0.05% to 2.0% by mass with respect to a total mass of the liquid chemical. A content of water in the liquid chemical refers to a content of water measured using a device based on a Karl Fischer moisture measurement method as measurement principle.

<Resin>

The liquid chemical may further include a resin. As the resin, a resin P having a group that is decomposed by the action of an acid to generate a polar group is more preferable. As the resin, a resin, which has a repeating unit represented by Formula (AI) and which is a resin in which solubility in a developer containing an organic solvent as a main component is reduced by the action of an acid, is more preferable. The resin having a repeating unit represented by Formula (AI) has a group that is decomposed by the action of an acid to generate an alkali-soluble group (hereinafter, also referred to as an "acid-decomposable group").

Examples of polar groups include an alkali-soluble group. Examples of alkali-soluble groups include a carboxy group, a fluorinated alcohol group (preferably a hexafluoroisopropanol group), a phenolic hydroxyl group, and a sulfo group.

A polar group in the acid-decomposable group is protected by a leaving group assisted by an acid (acid leaving group). Examples of acid leaving groups include $-C(R_{36})(R_{37})(R_{38})$, $-C(R_{36})(R_{37})(OR_{39})$, and $-C(R_{01})(R_{02})(OR_{39})$, and the like.

In the formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Hereinafter, the resin P in which solubility in a developer containing an organic solvent as a main component is reduced by the action of an acid will be described in detail.

(Formula (AI): Repeating Unit having Acid-Decomposable Group)

The resin P preferably contains a repeating unit represented by Formula (AI).

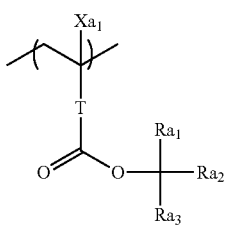

(AI)

In Formula (AI),

Xa$_1$ represents a hydrogen atom, or an alkyl group which may have a substituent;

T represents a single bond or a divalent linking group; and

Ra$_1$ to Ra$_3$ each independently represent a (linear or branched) alkyl group or a (monocyclic or polycyclic) cycloalkyl group, where two of Ra$_1$ to Ra$_3$ may be bonded to each other to form a (monocyclic or polycyclic) cycloalkyl group.

Examples of alkyl groups which may have a substituent and is represented by Xa$_1$ include a methyl group and a group represented by —CH$_2$—R$_{11}$. R$_{11}$ represents a halogen atom (such as a fluorine atom), a hydroxyl group, or a monovalent organic group.

Xa$_1$ is preferably a hydrogen atom, a methyl group, a trifluoromethyl group, or a hydroxymethyl group.

Examples of divalent linking groups for T include an alkylene group, a —COO-Rt- group, a —O-Rt- group, and the like. In the formula, Rt represents an alkylene group or a cycloalkylene group.

T is preferably a single bond or a —COO-Rt- group. Rt is preferably an alkylene group having 1 to 5 carbon atoms and is more preferably a —CH$_2$— group, a —(CH$_2$)$_2$— group, or a —(CH$_2$)$_3$— group.

An alkyl group for Ra$_1$ to Ra$_3$ preferably has 1 to 4 carbon atoms.

As a cycloalkyl group for Ra$_1$ to Ra$_3$, monocyclic cycloalkyl groups such as a cyclopentyl group or a cyclohexyl group; or polycyclic cycloalkyl groups such as a norbornyl group, a tetracyclodecanyl group, a tetracyclododecanyl group, or an adamantyl group are preferable.

As a cycloalkyl group formed by bonding of two of Ra$_1$ to Ra$_3$ to each other, monocyclic cycloalkyl groups such as a cyclopentyl group or a cyclohexyl group; or polycyclic cycloalkyl groups such as a norbornyl group, a tetracyclodecanyl group, a tetracyclododecanyl group, or an adamantyl group are preferable. A monocyclic cycloalkyl group having 5 to 6 carbon atoms is more preferable.

In the above-mentioned cycloalkyl group formed by bonding of two of Ra$_1$ to Ra$_3$ to each other, for example, one of methylene groups constituting a ring may be substituted by a hetero atom such as an oxygen atom, or by a group having a hetero atom such as a carbonyl group.

In the repeating unit represented by Formula (AI), for example, an aspect is preferable, in which Ra$_1$ is a methyl group or an ethyl group, and Rae and Ra$_3$ are boned to each other to form the above-described cycloalkyl group.

Each of the above groups may have a substituent. Examples of substituents include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like, where the number of carbon atoms is preferably 8 or less.

A content of the repeating unit represented by Formula (AI) is preferably 20 to 90 mol %, more preferably 25 to 85 mol %, and even more preferably 30 to 80 mol % with respect to all repeating units in the resin P.

(Repeating Unit having Lactone Structure)

In addition, the resin P preferably contains a repeating unit Q having a lactone structure.

The repeating unit Q having a lactone structure preferably has a lactone structure in a side chain, and it is more preferably a repeating unit derived from a (meth)acrylic acid derivative monomer.

As the repeating unit Q having a lactone structure, one kind thereof may be used alone, or two or more kinds thereof may be used in combination, but it is preferable to use one kind alone.

A content of the repeating unit Q having a lactone structure is preferably 3 to 80 mol % and more preferably 3 to 60 mol % with respect to all repeating units in the resin P.

The lactone structure is preferably a 5- to 7-membered lactone structure, and is more preferably a structure in which another ring structure is condensed with a 5- to 7-membered lactone structure to form a bicyclo structure or a Spiro structure.

The lactone structure preferably has a repeating unit having a lactone structure represented by any of Formulas (LC1-1) to (LC1-17). The lactone structure is preferably a lactone structure represented by Formula (LC1-1), Formula (LC1-4), Formula (LC1-5), or Formula (LC1-8), and is more preferably a lactone structure represented by Formula (LC1-4).

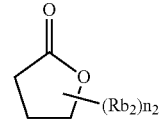

LC1-1

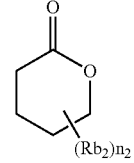

LC1-2

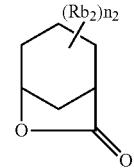

LC1-3

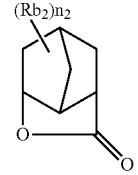

LC1-4

LC1-5 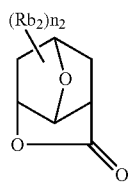

LC1-6 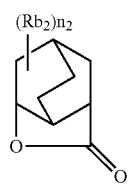

LC1-7 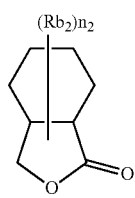

LC1-8 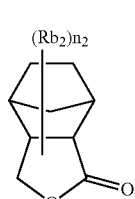

LC1-9 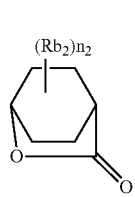

LC1-10 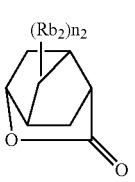

LC1-11 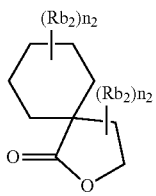

LC1-12 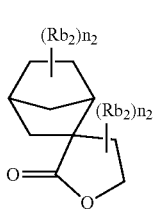

LC1-13 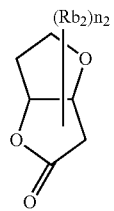

LC1-14 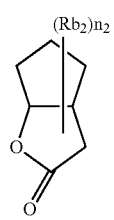

LC1-15 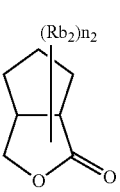

LC1-16 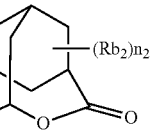

LC1-17 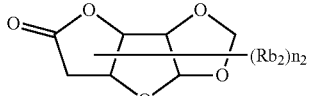

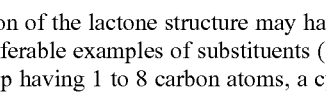

A portion of the lactone structure may have a substituent $(Rb_2)$. Preferable examples of substituents $(Rb_2)$ include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like. $n_2$ represents an integer of 0 to 4. In a case where $n_2$ is 2 or more, a plurality of substituents $(Rb_2)$ may be the same as or different from each other, or a plurality of substituents $(Rb_2)$ may be bonded to each other to form a ring.

(Repeating Unit having Phenolic Hydroxyl Group)

The resin P may contain a repeating unit having a phenolic hydroxyl group.

Examples of repeating units having a phenolic hydroxyl group include a repeating unit represented by General Formula (I).

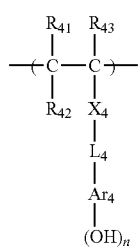
(I)

In the formula, $R_{41}$, $R_{42}$, and $R_{43}$ each independently represent a hydrogen atom, an alkyl group, a halogen atom, a cyano group, or an alkoxycarbonyl group, where $R_{42}$ may be bonded to $Ar_4$ to form a ring, and in this case, $R_{42}$ represents a single bond or an alkylene group.

$X_4$ represents a single bond, —COO—, or —$CONR_{64}$—, and $R_{64}$ represents a hydrogen atom or an alkyl group.

$L_4$ represents a single bond or an alkylene group.

$Ar_4$ represents a (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

As an alkyl group for $R_{41}$, $R_{42}$, and $R_{43}$ to in General Formula (I), an alkyl group having 20 or less carbon atoms is preferable, an alkyl group having 8 or less carbon atoms is more preferable, and an alkyl group having 3 or less carbon atoms is even more preferable, where alkyl groups may have a substituent, and examples of alkyl groups include a methyl group, an ethyl group, a propyl group, an isopropyl group, an n-butyl group, a sec-butyl group, a hexyl group, a 2-ethylhexyl group, an octyl group, a dodecyl group, and the like.

A cycloalkyl group for $R_{41}$, $R_{42}$, and $R_{43}$ in General Formula (I) may be a monocyclic type or a polycyclic type. The cycloalkyl group is preferably a monocyclic cycloalkyl group such as a cyclopropyl group, a cyclopentyl group, and a cyclohexyl group, where the cycloalkyl group has 3 to 8 carbon atoms and may have a substituent.

Examples of halogen atoms for $R_{41}$, $R_{42}$, and $R_{43}$ in General Formula (I) include a fluorine atom, a chlorine atom, a bromine atom, and an iodine atom, where a fluorine atom is preferable.

As an alkyl group contained in an alkoxycarbonyl group for $R_{41}$, $R_{42}$, and $R_{43}$ in General Formula (I), the same as those described for the above-described alkyl group in $R_{41}$, $R_{42}$, and $R_{43}$ are preferable.

Examples of substituents in each of the above groups include an alkyl group, a cycloalkyl group, an aryl group, an amino group, an amide group, a ureido group, a urethane group, a hydroxy group, a carboxy group, a halogen atom, an alkoxy group, a thioether group, an acyl group, an acyloxy group, an alkoxycarbonyl group, a cyano group, a nitro group, and the like, where the substituent preferably has 8 or less carbon atoms.

$Ar_4$ represents an (n+1)-valent aromatic ring group. Examples of divalent aromatic ring groups in a case where n is 1 include arylene groups such as a phenylene group, a tolylene group, a naphthylene group, and an anthracenylene group, where an arylene group has 6 to 18 carbon atoms and may have a substituent; and aromatic ring groups including a heterocyclic ring such as thiophene, furan, pyrrole, benzothiophene, benzofuran, benzopyrrole, triazine, imidazole, benzimidazole, triazole, thiadiazole, and thiazole.

Specific examples of (n+1)-valent aromatic ring groups in a case where n is an integer of 2 or more include groups in which (n−1) arbitrary hydrogen atoms have been removed from the above-described specific examples of the divalent aromatic ring groups.

The (n+1)-valent aromatic ring group may further have a substituent.

Examples of substituents that may be included in the above-mentioned alkyl group, cycloalkyl group, alkoxycarbonyl group, alkylene group, and (n+1)-valent aromatic ring group include alkyl groups exemplified for $R_{41}$, $R_{42}$, and $R_{43}$ in General Formula (I); alkoxy groups such as a methoxy group, an ethoxy group, a hydroxyethoxy group, a propoxy group, a hydroxypropoxy group, and a butoxy group; and aryl groups such as a phenyl group.

As an alkyl group for $R_{64}$ in —$CONR_{64}$— (where $R_{64}$ represents a hydrogen atom or an alkyl group) represented by $X_4$, an alkyl group having 20 or less carbon atoms is preferable, and an alkyl group having 8 or less carbon atoms is more preferable, where alkyl groups may have a substituent, and examples of alkyl groups include a methyl group, an ethyl group, a propyl group, an isopropyl group, an n-butyl group, a sec-butyl group, a hexyl group, a 2-ethylhexyl group, an octyl group, a dodecyl group, and the like.

$X_4$ is preferably a single bond, —COO—, or —CONH—, and is more preferably a single bond or —COO—.

An alkylene group for $L_4$ is preferably an alkylene group such as a methylene group, an ethylene group, a propylene group, a butylene group, a hexylene group, and an octylene group, where an alkylene group has 1 to 8 carbon atoms and may have a substituent.

$Ar_4$ is preferably an aromatic ring group which has 6 to 18 carbon atoms and may have a substituent, and is more preferably a benzene ring group, a naphthalene ring group, or a biphenylene ring group.

The repeating unit represented by General Formula (I) preferably has a hydroxystyrene structure. That is, $Ar_4$ is preferably a benzene ring group.

A content of the repeating unit having a phenolic hydroxyl group is preferably 0 to 50 mol %, more preferably 0 to 45 mol %, and even more preferably 0 to 40 mol % with respect to all repeating units in the resin P.

(Repeating Unit Containing Organic Group Having Polar Group)

The resin P may further contain a repeating unit containing an organic group having a polar group, in particular, a repeating unit having an alicyclic hydrocarbon structure substituted by a polar group. Thereby, adhesiveness to substrates and affinity for developers are improved.

The alicyclic hydrocarbon structure substituted by a polar group is preferably an adamantyl group, a diamantyl group, or a norbornane group. The polar group is preferably a hydroxyl group or a cyano group.

In a case where the resin P contains the repeating unit containing an organic group having a polar group, a content thereof is preferably 1 to 50 mol %, more preferably 1 to 30 mol %, even more preferably 5 to 25 mol %, and particularly preferably 5 to 20 mol % with respect to all repeating units in the resin P.

(Repeating Unit Represented by General Formula (VI))

The resin P may contain a repeating unit represented by General Formula (VI).

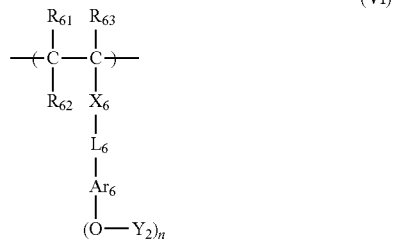

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group, where $R_{62}$ may be bonded to $Ar_6$ to form a ring, and in this case, $R_{62}$ represents a single bond or an alkylene group;

$X_6$ represents a single bond, —COO—, or —CONR$_{64}$—; $R_{64}$ represents a hydrogen atom or an alkyl group;

$L_6$ represents a single bond or an alkylene group;

$Ar_6$ represents a (n+1)-valent aromatic ring group, and in a case where $Ar_6$ is bonded to $R_{62}$ to form a ring, $Ar_6$ represents an (n+2)-valent aromatic ring group;

$Y_2$'s each independently represent a hydrogen atom, or a leaving group assisted by the action of an acid in a case where n≥2, where at least one of $Y_2$'s represents a leaving group assisted by the action of an acid; and n represents an integer of 1 to 4.

As a leaving group $Y_2$ assisted by the action of an acid, a structure represented by General Formula (VI-A) is preferable.

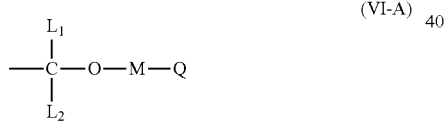

$L_1$ and $L_2$ each independently represent a hydrogen atom, an alkyl group, a cycloalkyl group, an aryl group, or a group in which an alkylene group and an aryl group are combined.

M represents a single bond or a divalent linking group.

Q represents an alkyl group, a cycloalkyl group which may contain a hetero atom, an aryl group which may contain a hetero atom, an amino group, an ammonium group, a mercapto group, a cyano group, or an aldehyde group.

At least two of Q, M, or $L_1$ may be bonded to each other to form a ring (preferably a 5- or 6-membered ring).

The repeating unit represented by General Formula (VI) is preferably a repeating unit represented by Formula (3).

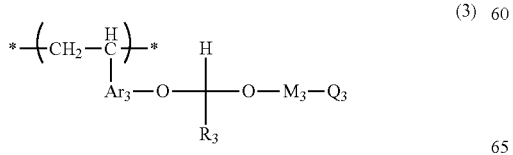

In General Formula (3), $Ar_3$ represents an aromatic ring group;

$R_3$ represents a hydrogen atom, an alkyl group, a cycloalkyl group, an aryl group, an aralkyl group, an alkoxy group, an acyl group, or a heterocyclic group;

$M_3$ represents a single bond or a divalent linking group; and $Q_3$ represents an alkyl group, a cycloalkyl group, an aryl group, or a heterocyclic group, where at least two of $Q_3$, $M_3$, or $R_3$ may be bonded to each other to form a ring.

The aromatic ring group represented by $Ar_3$ is the same as $Ar_6$ in General Formula (VI) in a case where n in General Formula (VI) is 1, and the aromatic ring group is preferably a phenylene group or a naphthylene group, and is more preferably a phenylene group.

(Repeating Unit having Silicon Atom in Side Chain)

The resin P may further contain a repeating unit having a silicon atom in a side chain. Examples of repeating units having a silicon atom in a side chain include a (meth) acrylate-based repeating unit having a silicon atom, a vinyl-based repeating unit having a silicon atom, and the like. The repeating unit having a silicon atom in and side chain is typically a repeating unit having a group having a silicon atom in a side chain. Examples of groups having a silicon atom include a trimethylsilyl group, a triethylsilyl group, a triphenylsilyl group, a tricyclohexylsilyl group, a tristrimethylsiloxysilyl group, a tristrimethylsilylsilyl group, a methylbistrimethylsilylsilyl group, a methylbistrimethylsiloxysilyl group, a dimethyltrimethylsilylsilyl group, and a dimethyltrimethylsiloxysilyl group; cyclic or linear polysiloxanes, or a cage-type, ladder-type, or random-type silsesquioxane structures which are shown below; and the like. In the formula, R and $R^1$ each independently represent a monovalent substituent. The symbol "*" represents a bond.

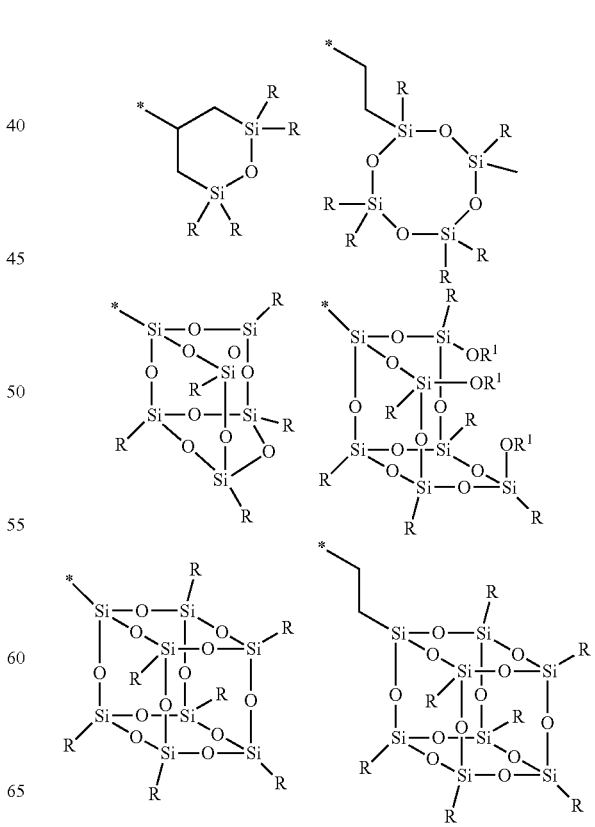

-continued

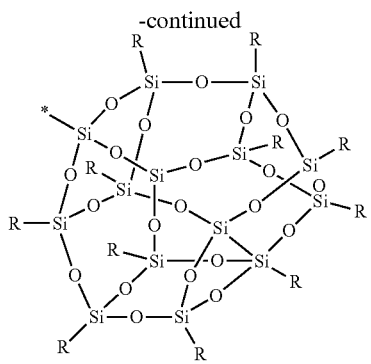

The repeating unit having the above group is preferably, for example, a repeating unit derived from an acrylate compound or a methacrylate compound which has the above group, or a repeating unit derived from a compound having the above group and a vinyl group.

In a case where the resin P has the repeating unit having a silicon atom in a side chain, a content thereof is preferably 1 to 30 mol %, more preferably 5 to 25 mol %, and even more preferably 5 to 20 mol % with respect to all repeating units in the resin P.

A weight-average molecular weight of the resin P is preferably 1,000 to 200,000, more preferably 3,000 to 20,000, and even more preferably 5,000 to 15,000 as a polystyrene equivalent value by gel permeation chromatography (GPC). In a case where a weight-average molecular weight is 1,000 to 200,000, it is possible to prevent a deterioration of heat resistance and dry etching resistance, and to prevent a deterioration of developability, and a deterioration of film formability due to increased viscosity.

A dispersity (molecular weight distribution) is generally 1 to 5, is preferably 1 to 3, is more preferably 1.2 to 3.0, and is even more preferably 1.2 to 2.0.

As other components (for example, acid-generating agents, basic compounds, quenchers, hydrophobic resins, surfactants, solvents, and the like) contained in the liquid chemical, any known components can be used.

[Use Applications of Liquid Chemical]

The liquid chemical according to the above embodiment is preferably used for manufacturing a semiconductor device. In particular, it is preferably used in a step including pattern formation using a KrF excimer laser and an ArF excimer laser.

The liquid chemical according to the above embodiment can be preferably used as a liquid chemical used in a process for a resist in which a pattern width and/or pattern interval is 20 to 80 nm. In addition, the liquid chemical according to the above embodiment can be preferably used as a liquid chemical used in a process for a resist in which a wiring width to be obtained and/or a wiring space to be obtained is 20 to 80 nm. More specifically, the liquid chemical is preferably used as a pre-wetting solution, a developer, a rinsing solution, a resist solution itself, a solvent for a resist solution, a peeling solution, and the like which are used in the above resist process. In other words, the liquid chemical is more preferably used for manufacturing a semiconductor device that is manufactured using a resist film having a pattern width and/or pattern space of 20 to 80 nm.

Specifically, the liquid chemical is used for treating an organic substance in a step of manufacturing a semiconductor device, including a lithography step, an etching step, an ion implantation step, a peeling step, and the like after completing the respective steps or before proceeding to the next step. Specifically, the liquid chemical is suitably used as a pre-wetting solution, a developer, a rinsing solution, a peeling solution, and the like. For example, the liquid chemical can be used for rinsing an edge line of a semiconductor substrate before and after resist application.

In addition, the liquid chemical can be used as a dilute solution of a resin contained in a resist solution, and a solvent contained in a resist solution. Furthermore, the liquid chemical may be diluted with other organic solvents and/or water and the like.

Furthermore, the liquid chemical can be suitably used for other use applications other than manufacture of semiconductor devices, and can also be used as a developer for polyimide, a resist for sensors, a resist for lenses; a rinsing solution; and the like.

Furthermore, the liquid chemical can be used as a solvent for medical use applications or cleaning use applications. In particular, the liquid chemical can be suitably used for cleaning containers, piping, substrates (such as wafers and glass), and the like.

Among the above examples, the present liquid chemical exhibits more excellent effects in a case of being adopted as a resist solution, a pre-wetting solution, a developer, and a rinsing solution in pattern formation using KrF excimer laser exposure and ArF excimer laser exposure.

[Analysis Method]

A method for analyzing a test target solution of the embodiment of the present invention is a method for analyzing a test target solution, the method including, in this order: a step A of applying a test target solution to a substrate to form a test target solution layer on the substrate, where the test target solution contains an organic solvent and metal-containing particles containing a metal atom; and a step B of analyzing the number of the metal-containing particles per unit area of the substrate.

(Step A)

The step A is a step of applying the test target solution to a substrate to form the test target solution layer on the substrate.

The test target solution is not particularly limited, and it is possible to appropriately used the liquid chemical already described above, a purification target substance used in production of the liquid chemical which is to be described later, and the like.

A method of applying the test target solution to the substrate is not particularly limited, but a method of dropwise adding a test target solution to a rotating substrate, or a method of dropwise adding a test target solution to a substrate and then rotating the substrate is preferable from the viewpoint that then, it is possible to apply a predetermined amount of the test target solution to a substrate.

An amount of the test target solution dropwise added is not particularly limited, but in general, it is preferably about 10 to 1,000 μL.

The application step may further have a step of drying the test target solution layer to remove an organic solvent. In this case, a heating method is not particularly limited, but a method of irradiation with light rays is preferable from the viewpoint that then, change in components in the test target solution is small, and the method can be performed in a short time. The light rays are not particularly limited, but infrared rays are preferable.

(Step B)

A step B is a step of measuring the number of metal-containing particles per unit area of a substrate (particles/$cm^2$). A method of evaluating the number of metal-containing particles per unit area of a substrate is not particularly limited, but for example, evaluation can be performed by combination use of a defect inspection device and an energy dispersive X-ray analyzer.

The defect inspection device is a device that irradiates a liquid chemical applied on a wafer with laser light rays, detects the laser light rays scattered by defects present on the wafer, and thereby detects the defects present on the wafer. It is a device that performs measurement while rotating the wafer at the case of irradiation with the laser light rays, and thereby determines coordinate positions of foreign matter and defects from a rotation angle of the wafer and a radial position of the laser light rays. In a case where elemental analysis is performed using the energy dispersive X-ray analysis method at a position of a specified defect, it is possible to evaluate a composition of the defect. In this case, defects containing a metal atom can be determined to be metal-containing particles.

Examples of such devices include "SP-5" manufactured by KLA-Tencor, but in addition to this device, a wafer surface inspection device (typically a succession machine of "SP-5" and the like) which has a resolution capability higher than a resolution capability of "SP-5" may be used.

In addition, in a case where the above device is used in combination with a fully automatic defect review and classification device "SEMVision G6" of Applied Materials, Inc., it is possible to evaluate the number of metal-containing particles per unit area of a substrate. The specific procedure is as described in Examples.

The step B may further have a step of calculating the number of metal-containing particles (particles/cm$^3$) per unit volume of the liquid chemical from the number of metal-containing particles per unit area of a substrate. A method of calculating the number of metal-containing particles (particles/cm$^3$) per unit volume of the liquid chemical is not particularly limited, and it is possible to obtain the number of metal-containing particles from the number of metal-containing particles per unit area of a substrate, and an amount (cm$^3$) of the liquid chemical applied to the substrate. The number of metal-containing particles is obtained by dividing the product of the number of metal-containing particles (the number of particles/cm$^2$) per unit area of a substrate and an area (cm$^2$) of the substrate to which the test target solution is applied, by an amount (cm$^3$) of the liquid chemical applied to the substrate.

[Method for Producing Liquid Chemical]

A method for producing the above-described liquid chemical is not particularly limited, and known production methods can be used. Among the methods, a method for producing a liquid chemical preferably includes a filtration step of filtering a purification target substance containing an organic solvent using a filter to obtain a liquid chemical from the viewpoint that then, a liquid chemical exhibiting more excellent effects of the present invention is obtained.

The purification target substance used in the filtration step is obtained by purchasing or the like, and by reacting raw materials. As the purification target substance, it is preferable to use the above-described substance in which a content of metal-containing particles and/or impurities is small. Examples of commercially available products of such purification target substance include a product called "high-purity grade product."

A method of obtaining a purification target substance (typically, a purification target substance containing an organic solvent) by reacting raw materials is not particularly limited, and known methods can be used. For example, there is a method in which one or plural raw materials are reacted in the presence of a catalyst to obtain an organic solvent.

More specific examples thereof include a method of reacting acetic acid and n-butanol in the presence of sulfuric acid to obtain butyl acetate; a method of reacting ethylene, oxygen, and water in the presence of $Al(C_2H_5)_3$ to obtain 1-hexanol; a method of reacting cis-4-methyl-2-pentene in the presence of Ipc2BH (Diisopinocampheylborane) to obtain 4-methyl-2-pentanol; a method of reacting propylene oxide, methanol, and acetic acid in the presence of sulfuric acid to obtain PGMEA (propylene glycol 1-monomethyl ether 2-acetate); a method of reacting acetone and hydrogen in the presence of copper oxide-zinc oxide-aluminum oxide to obtain IPA (isopropyl alcohol); a method of reacting lactic acid and ethanol to obtain ethyl lactate; and the like.

<Filtration Step>

The method for producing a liquid chemical according to the embodiment of the present invention includes a filtration step of filtering the above-mentioned purification target substance using a filter to obtain a liquid chemical. A method of filtering the purification target substance using a filter is not particularly limited, and it is preferable that the purification target substance be passed through (allowing a liquid to be passed through) a filter unit having a housing and a cartridge filter housed in the housing under pressurization or non-pressurization.

Pore Diameter of Filter

A pore diameter of the filter is not particularly limited, and it is possible to use filters having a pore diameter which are generally used for filtering a purification target substance. Among the filters, a pore diameter of the filter is preferably 200 nm or smaller, more preferably 20 nm or smaller, even more preferably 10 nm or smaller, particularly preferably 5 nm or smaller, and most preferably 3 nm or smaller, from the viewpoint that then, it is possible to easily control the number of particles contained in the liquid chemical which have a particle size of 10 to 100 nm within a desired range. The lower limit value is not particularly limited, but in general, it is preferably 1 nm or larger from the viewpoint of productivity.

In the present specification, a pore diameter and pore diameter distribution of the filter respectively refer to a pore diameter and pore diameter distribution determined by a bubble point of isopropanol (IPA) or HFE-7200 ("Novec 7200," manufactured by 3M, hydrofluoroether, $C_4F_9OC_2H_5$).

In a case where a pore diameter of the filter is 5 nm or smaller, this is preferable from the viewpoint that then, it is possible to easily control the number of particles contained in the liquid chemical which have a particle size of 10 to 100 nm. Hereinafter, a filter having a pore diameter of 5 nm or smaller is also referred to as a "micropore diameter filter."

The micropore diameter filter may be used alone or in combination with a filter having a different pore diameter. Among filters, it is preferable to use a filter having a larger pore diameter in combination from the viewpoint of more excellent productivity. In this case, a liquid of a purification target substance, which has been filtered through a filter having a larger pore diameter in advance, is passed through the micropore diameter filter, whereby clogging of the micropore diameter filter can be prevented.

That is, as a pore diameter of the filter, in a case of using one filter, a pore diameter of the filter is preferably 5.0 nm or smaller, and in a case of using two or more filters, the smallest pore diameter among pore diameters of the filters is preferably 5.0 nm or smaller.

An aspect in which two or more kinds of filters having different pore diameters are sequentially used is not particularly limited, and examples thereof include a method of sequentially disposing the above-described filter units along a pipe line through which a purification target substance is transferred. At this case, in a case where a flow rate of a purification target substance per unit time is made constant in the entire pipe line, in some cases, a larger pressure is applied to a filter unit having a smaller pore diameter as compared with a filter unit having a larger pore diameter. In this case, it is preferable to increase a filtration area by disposing a pressure adjustment valve, a damper, and the like between filter units, and thereby making a pressure applied to a filter unit having a small pore diameter constant, or by disposing the filter units in which the same filter is housed in parallel along the pipe line. Accordingly, it is possible to more stably control the number of particles of 10 to 100 nm contained in the liquid chemical.

Material of Filter

A material of the filter is not particularly limited, and known materials for the filter can be used. Specific examples thereof in a case where a resin is used include polyamides such as 6-nylon and 6,6-nylon; polyolefins such as polyethylene and polypropylene; polystyrene; polyimide; polyamide imide; poly(meth)acrylate; polyfluorocarbons such as polytetrafluoroethylene, perfluoroalkoxyalkane, perfluoroethylene propene copolymer, ethylene-tetrafluoroethylene copolymer, ethylene-chlorotrifluoroethylene copolymer, polychlorotrifluoroethylene, polyvinylidene fluoride, and polyvinyl fluoride; polyvinyl alcohols; polyesters; celluloses; cellulose acetates; and the like. Among the examples, at least one selected from the group consisting of nylon (among which 6,6-nylon is preferable), polyolefins (among which polyethylene is preferable), poly(meth)acrylates, and polyfluorocarbons (among which polytetrafluoroethylene (PTFE) and perfluoroalkoxyalkane (PFA) are preferable) is preferable from the viewpoint that then, a filter has more excellent solvent resistance, and a liquid chemical to be obtained exhibits more excellent defect inhibitive performance. As these polymers, one kind thereof can be used alone or two or more kinds thereof can be used in combination.

Furthermore, in addition to the resin, diatomaceous earth, glass, and the like may be used.

In addition, the filter may be surface-treated. A method of surface treatment is not particularly limited, and known methods can be used. Examples of a method of surface treatment include a chemical modification treatment, a plasma treatment, a hydrophobic treatment, coating, a gas treatment, sintering, and the like.

A plasma treatment is preferable because then a surface of the filter is hydrophilized. A water contact angle on a surface of the filtration material that has been hydrophilized by a plasma treatment is not particularly limited, but a static contact angle at 25° C. measured by a contact angle meter is preferably 60° or less, more preferably 50° or less, and even more preferably 30° or less.

As a chemical modification treatment, a method of introducing an ion exchange group into a base material is preferable.

That is, as the filter, a filter in which each of the above-described materials is used as a base material and an ion exchange group is introduced into the base material is preferable. Typically, a filter including a base material having an ion exchange group on a surface thereof is preferable. A surface-modified base material is not particularly limited, and a base material in which an ion exchange group is introduced into the above-mentioned polymer is preferable from the viewpoint that then, production becomes easier.

Regarding an ion exchange group, examples of cation exchange groups include a sulfonic acid group, a carboxy group, a phosphoric acid group, and the like, and examples of anion exchange groups include a quaternary ammonium group and the like. A method of introducing an ion exchange group into a polymer is not particularly limited, and examples thereof include a method of reacting a compound having an ion exchange group and a polymerizable group with a polymer for typically grafting.

A method of introducing an ion exchange group is not particularly limited, but fibers of the above-mentioned resin are irradiated with ionizing radiation (such as $\alpha$-rays, $\beta$-rays, $\gamma$-rays, X-rays, electron rays, and the like) to generate active portions (radicals) in the resin. This irradiated resin is immersed in a monomer-containing solution to graft-polymerize the monomer onto a base material. As a result, a polymer in which this monomer is bonded to resin fibers as a graft-polymerized side chain is generated. By contacting and reacting a resin having this generated polymer as a side chain with a compound having an anion exchange group or a cation exchange group, an ion exchange group is introduced into the polymer of the graft-polymerized side chain, and thereby a final product is obtained.

In addition, the filter may have a configuration in which a woven or a non-woven fabric in which an ion exchange group is formed by a radiation graft polymerization method is combined with a filtration material of the related art such as a glass wool, a woven, or a non-woven fabric.

In a case where a filter having an ion exchange group is used, it is easy to control a content of particles containing a metal atom in the liquid chemical within a desired range. A material of the filter having an ion exchange group is not particularly limited, and examples thereof include a material in which an ion exchange group has been introduced into polyfluorocarbon or polyolefin, and a material in which an ion exchange group has been introduced into polyfluorocarbon is preferable.

A pore diameter of the filter having an ion exchange group is not particularly limited, but it is preferably 1 to 30 nm and more preferably 5 to 20 nm. The filter having an ion exchange group may also serve as the above-mentioned filter having the smallest pore diameter, or may be used separately from the filter having the smallest pore diameter. Among the examples, as the filtration step, an aspect is preferable in which a filter having an ion exchange group is used in combination with a filter not having an ion exchange group and having the smallest pore diameter, from the viewpoint that then, it is possible to obtain a liquid chemical exhibiting more excellent effects of the present invention.

A material of the above-described filter having the smallest pore diameter is not particularly limited, but in general, at least one selected from the group consisting of polyfluorocarbons and polyolefins is preferable, and polyolefin is more preferable from the viewpoint of solvent resistance and the like.

In addition, in a case where a material of the filter is polyamide (particularly, nylon), it is possible to more easily control a content of a high-boiling point organic compound and the like in the liquid chemical, and in particular, it is possible to further more easily control a content of the metal-containing particles containing the high-boiling point organic compound in the liquid chemical.

Accordingly, as the filter used in the filtration step, it is preferable to use two or more kinds of filters of different materials, and it is more preferable to use two or more kinds thereof selected from the group consisting of polyolefins, polyfluorocarbons, polyamides, and a base material in which an ion exchange group has been introduced in these materials.

Pore Structure of Filter

A pore structure of the filter is not particularly limited, and it may be appropriately selected according to components in a purification target substance. In the present specification, a pore structure of a filter means pore diameter distribution, positional distribution of pores in a filter, a shape of pores, and the like, and it can be typically controlled by a method for manufacturing a filter.

For example, in a case where a filter is formed by sintering a powder of a resin or the like, a porous film can be obtained, and in a case where a filter is formed by a method such as electrospinning, electroblowing, and melt-blowing, a fiber film can be obtained. These filters respectively have different pore structures.

A "porous film" refers to a film allowing components in a purification target substance such as gels, particles, colloids, cells, and oligomers to be retained, and allowing components that are substantially smaller than pores to be passed through the pores. The retention of components in a purification target substance by the porous film may depend in operating conditions such as a surface velocity, use of surfactants, a pH, and a combination thereof, and may depend on a pore diameter and structure of the porous film, and a size and structure (whether particles are hard particles, gels, or the like) of particles to be removed.

In a case where a purification target substance contains, as impurities, the particles (which may be in a gel form) which contain a high-boiling point organic compound, particles containing a high-boiling point organic compound are negatively charged in many cases, and a filter made of polyamide performs a function of a non-sieve film for removing such particles. Typical examples of non-sieve films include nylon films such as nylon-6 films and nylon-6,6 films, but examples are not limited thereto.

The "non-sieving" retention mechanism referred to in the present specification refers to retention by mechanisms, such as obstruction, diffusion, and adsorption, which are not related to filter pressure drop or pore diameters.

The non-sieving retention includes retention mechanisms, such as obstruction, diffusion, and adsorption, which remove removal target particles from a purification target substance, and which are not related to filter pressure drop or filter pore diameters. The adsorption of particles on a filter surface can be mediated by, for example, intermolecular Van der Waals forces, electrostatic forces, or the like. An obstructive effect occurs in a case where particles traveling in a non-sieving film layer having a tortuous path cannot change their direction quickly enough to avoid coming into contact with the non-sieving film. Particle transport by diffusion mainly occurs from random motion or Brownian motion of small particles, which creates a certain probability that the particles will collide with a filtration material. The non-sieving retention mechanism becomes active in a case where no repulsion force is present between particles and a filter.

Ultra high molecular weight polyethylene (UPE) filters are typically sieve films. A sieve film refers to a film that mainly captures particles by a sieving retention mechanism, or a film that is optimized for capturing particles by a sieving retention mechanism.

Typical examples of sieve films include polytetrafluoroethylene (PTFE) films and UPE films, but examples are not limited thereto.

The "sieving retention mechanism" refers to retention resulted due to removal target particles being larger than a pore diameter of a porous film. A sieving retention force can be improved by formation of a filter cake (aggregation of removal target particles on a film surface). The filter cake effectively performs a function of a secondary filter.

A material of a fiber layer is not particularly limited as long as it is a polymer from which a fiber layer can be formed. Examples of polymers include polyamide and the like. Examples of polyamides include nylon 6, nylon 6,6, and the like. The polymer for forming a fiber film may be poly(ethersulfone). In a case where a fiber film is on a primary side of a porous film, surface energy of the fiber film is preferably higher than that of a polymer that is a material of the porous film and is on a secondary side. Examples of such combinations include a case in which a material of the fiber film is nylon and a porous film is polyethylene (UPE).

As the filter used in the filtration step, it is preferable to use two or more kinds of filters having different pore structures, and it is more preferable to use a filter of a porous film and a fiber film. Specifically, it is preferable to use a filter of a nylon fiber film and a filter of a UPE porous film in combination.

As described above, the filtration step according to the embodiment of the present invention is preferably a multi-stage filtration step in which a purification target substance is passed through two or more kinds of filters different in at least one selected from the group consisting of a filter material, a pore diameter, and a pore structure.

(Multi-Stage Filtration Step)

The multi-stage filtration step can be performed using known purification devices. FIG. 1 is a schematic diagram showing a typical example of a purification device with which the multi-stage filtration step can be performed. A purification device 10 includes a production tank 11, a filtration device 16, and a filling device 13, and the respective units are connected by a pipe line 14.

The filtration device 16 has filter units 12(a) and 12(b) connected by the pipe line 14. An adjustment valve 15(a) is disposed in the pipe line between the filter units 12(a) and 12(b).

In FIG. 1, a purification target substance is stored in the production tank 11. Next, a pump (not shown) disposed in the pipe line 14 is operated, and the purification target substance is sent from the production tank 11 to the filtration device 16 via the pipe line 14. A direction in which the purification target substance is transferred in the purification device 10 is indicated by $F_1$ in FIG. 1.

The filtration device 16 consists of the filter units 12(a) and 12(b) connected by the pipe line 14. In each of the two filter units, a filter cartridge, which has filters different in at least one selected from the group consisting of a pore diameter, a material, and a pore structure, is housed. The filtration device 16 has a function of filtering a purification target substance supplied through a pipe line by a filter.

The filter housed in the respective filter units is not particularly limited, but a filter having the smallest pore diameter is preferably housed in the filter unit 12(b).

By operating the pump, the purification target substance is supplied to the filter unit 12(a) to be filtered. The purification target substance filtered by the filter unit 12(a) is reduced in pressure as needed by the adjustment valve 15(a), and supplied to the filter unit 12(b) to be filtered.

The purification device may not include the adjustment valve 15(a). In addition, even in a case where the purification device includes the adjustment valve 15(a), a position thereof may not be on a primary side of the filter unit 12(*b*) and may be on a primary side of the filter unit 12(*a*).

Furthermore, as a device capable of adjusting a supply pressure for a purification target substance, a device other than the adjustment valve may be used. Examples of such a member include a damper and the like.

In addition, in the filtration device 16, each filter forms a filter cartridge, but a filter that can be used in the purification method according to the present embodiment is not limited to the above-described embodiment. For example, an aspect in which a purification target substance is passed through a filter formed in a flat plate shape may be employed.

Furthermore, a configuration is employed in which, in the purification device 10, a purification target substance that has been filtered by the filter unit 12(*b*) is transferred to the filling device 13 and accommodated in a container. However, the filtration device for performing the above-described purification method is not limited to the above configuration, and a configuration may be employed in which a purification target substance that has been filtered by the filter unit 12(*b*) is returned to the production tank 11, and a liquid thereof is again passed through the filter unit 12(*a*) and the filter unit 12(*b*). The above-mentioned filtration method is called circulation filtration. In purification of a purification target substance by the circulation filtration, at least one of two or more kinds of filters is used twice or more. In the present specification, an operation of returning a filtered purification target substance, which has been filtered by the respective filter units, to the production tank is counted as one circulation.

The number of circulations may be appropriately selected according to components in a purification target substance, and the like.

A material of a liquid-contacting part (referring to an inner wall surface or the like with which a purification target substance and the liquid chemical may come into contact) of the above-mentioned purification device is not particularly limited, but the liquid-contacting part is preferably formed of at least one kind (hereinafter, also collectively referred to as a "corrosion-resistant material") selected from the group consisting of a non-metallic material and an electrolytically polished metallic material. For example, in a case where the liquid-contacting part of the production tank is formed of a corrosion-resistant material, this means there are cases in which the production tank itself consists of a corrosion-resistant material, or an inner wall or the like of the production tank is coated with a corrosion-resistant material.

The above-mentioned non-metallic material is not particularly limited, and known materials can be used.

Examples of non-metallic materials include at least one selected from the group consisting of a polyethylene resin, a polypropylene resin, a polyethylene-polypropylene resin, a tetrafluoroethylene resin, a tetrafluoroethylene-perfluoroalkyl vinyl ether copolymer resin, a tetrafluoroethylene-hexafluoropropylene copolymer resin, a tetrafluoroethylene-ethylene copolymer resin, a trifluorochloroethylene-ethylene copolymer resin, a fluorovinylidene resin, a trifluorochloroethylene copolymer resin, and a fluorovinyl resin, but examples are not limited thereto.

The above-mentioned metallic material is not particularly limited, and known materials can be used.

Examples of metallic materials include metallic materials in which a total content of chromium and nickel is more than 25% by mass with respect to a total mass of the metallic material, and among the metallic materials, a metallic material in which a total content of chromium and nickel is 30% by mass or more with respect to a total mass of the metallic material is preferable. The upper limit value of a total content of chromium and nickel in the metallic material is not particularly limited, but it is preferably 90% by mass or less.

Examples of metallic materials include stainless steel, a nickel-chromium alloy, and the like.

The stainless steel is not particularly limited, and known stainless steels can be used. Among the steels, an alloy containing nickel at 8% by mass or more is preferable, and an austenitic stainless steel containing nickel at 8% by mass or more is more preferable. Examples of austenitic stainless steels include SUS (Steel Use Stainless) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

The nickel-chromium alloy is not particularly limited, and known nickel-chromium alloys can be used. Among the nickel-chromium alloys, a nickel-chromium alloy having a nickel content of 40% to 75% by mass and a chromium content of 1% to 30% by mass is preferable.

Examples of nickel-chromium alloys include HASTELLOY (trade name, the same applies hereinafter), MONEL (trade name, the same applies hereinafter), INCONEL (trade name, hereinafter the same), and the like. More specific examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

In addition, the nickel-chromium alloy may further contain boron, silicon, tungsten, molybdenum, copper, cobalt, and the like if necessary, in addition to the above alloys.

A method of electrolytically polishing a metallic material is not particularly limited, and known methods can be used. For example, it is possible to use methods described in paragraphs 0011 to 0014 of JP2015-227501A, paragraphs 0036 to 0042 of JP2008-264929A, and the like.

In a case where the metallic material is electrolytically polished, it is presumed that a content of chromium in a passivation layer on a surface becomes larger than a content of chromium in a primary phase. Accordingly, in a case of using a purification device in which a liquid-contacting part is formed of a metallic material that has been electrolytically polished, it is presumed that metal-containing particles in a purification target substance are unlikely to flow out.

The metallic material may be buff-polished. A method of buff polishing is not particularly limited, and known methods can be used. A size of abrasive grains for polishing used for buff polishing finish is not particularly limited, but it is preferably #400 or less from the viewpoint that then unevenness of a surface of the metallic material is easily reduced. The buff polishing is preferably performed before the electrolytic polishing.

<Other Steps>

The method for producing a liquid chemical according to the embodiment of the present invention is not particularly limited as long as it has the filtration step, and the method may further include steps other than the filtration step. Examples of steps other than the filtration step include a distillation step, a reaction step, a static electricity removal step, and the like.

(Distillation Step)

The distillation step is a step of distilling a purification target substance containing an organic solvent to obtain a distilled purification target substance. A method of distilling a purification target substance is not particularly limited, and known methods can be used. Typical examples thereof include a method in which a distillation column is disposed on a primary side of the above-described purification device, and a distilled purification target substance is introduced into a production tank.

In this case, a liquid-contacting part of the distillation column is not particularly limited, but it is preferably formed of the above-described corrosion-resistant material.

The distillation step is more preferably a step in which the purification target substance contains an organic solvent and an organic compound having a boiling point of 300° C. or higher, and a content of the organic compound a distilled purification target substance is $1.0 \times 10^{-3}$ mass ppt to $1.0 \times 10^3$ mass ppm, from the viewpoint that then, a liquid chemical exhibiting more excellent effects of the present invention is obtained.

A content of the organic compound in the distilled purification target substance is more preferably 1.0 mass ppt to $1.0 \times 10^3$ mass ppm, and even more preferably 1.0 mass ppb to $1.0 \times 10^2$ mass ppm.

(Reaction Step)

The reaction step is a step of reacting raw materials to generate a purification target substance containing an organic solvent as a reactant. A method of generating a purification target substance is not particularly limited, and known methods can be used. Typical examples thereof include a method in which a reactor is disposed on a primary side of the production tank (or the distillation column) of the purification device described above, and the reactant is introduced into the production tank (or the distillation column).

In this case, a liquid-contacting part of the reactor is not particularly limited, but it is preferably formed of the above-described corrosion-resistant material.

(Static Electricity Removal Step)

The static electricity removal step is a step of reducing charge potential of the purification target substance by removing static electricity of the purification target substance.

A method of static electricity removal is not particularly limited, and known static electricity removal methods can be used. Examples of methods of static electricity removal include a method of bringing a purification target substance into contact with a conductive material.

A contact time for bringing a purification target substance into contact with a conductive material is preferably 0.001 to 60 seconds, more preferably 0.001 to 1 second, and even more preferably 0.01 to 0.1 seconds. Examples of conductive materials include stainless steel, gold, platinum, diamond, glassy carbon, and the like.

Examples of methods of bringing a purification target substance into contact with a conductive material include a method in which a grounded mesh consisting of a conductive material is disposed inside a pipe line, and a purification target substance is passed therethrough.

In purification of a purification target substance, opening of a container, cleaning of the container and the devices, accommodation of a solution, analysis, and the like, which are accompanying procedures of the purification, are all preferably performed in a clean room. The clean room is preferably a clean room having a cleanliness of 4 or higher which is specified by International Standard ISO 14644-1: 2015 specified by the International Organization for Standardization. Specifically, the clean room preferably satisfies any of ISO class 1, ISO class 2, ISO class 3, and ISO class 4; more preferably satisfies ISO class 1 or ISO class 2; and even more preferably satisfies ISO class 1.

A storage temperature for the liquid chemical is not particularly limited, but the storage temperature is preferably 4° C. or higher from the viewpoint that then, a trace amount of impurities and the like contained in the liquid chemical are less likely to be eluted, and as a result, more excellent effects of the present invention are obtained.

Another Embodiment of Method for Producing Liquid Chemical

Another embodiment of the method for producing a liquid chemical of the embodiment of the present invention is a method for producing a liquid chemical, the method including: a first step of purifying a purification target substance that contains metal-containing particles containing a metal atom and having a particle size of 10 to 100 nm to obtain a purified purification target substance; a second step of removing some of the purified purification target substance to obtain a test target solution; and a third step of applying the test target solution to a substrate, measuring the number of metal-containing particles per unit area of the substrate after the application, and repeatedly performing the first step and the second step until the measured value becomes equal to or less than a predetermined value to obtain a liquid chemical.

According to the above-described method for producing a liquid chemical, it is possible to easily produce a liquid chemical exhibiting more excellent effects of the present invention.

(First Step)

The first step is a step of purifying the purification target substance to obtain a purified purification target substance. Regarding the purification target substance and a method of purifying the purification target substance, the same contents as described above are applied.

(Second Step)

The second step is a step of removing some of the purified purification target substance to obtain the test target solution. An amount of the test target solution taken out from the purified purification target substance is not particularly limited, but it is sufficient for the amount be an amount sufficient for performing the analysis method described above.

In addition, a method of taking out the test target solution from the purified purification target substance is not particularly limited, and the test target solution may be taken out from a tank, a pipe line, or the like in the production device for the liquid chemical, or some of the purified purification target substance that is housed in a container may be used.

(Third Step)

The third step is a step of applying the test target solution to a substrate, measuring the number of metal-containing particles per unit area of the substrate after the application, and repeatedly performing the first step and the second step until the measured value becomes equal to or less than a predetermined reference value.

A method of measuring the number of metal-containing particles per unit area of a substrate is not particularly limited, and it is preferable to use the analysis method described above. In addition, a reference value may be determined in advance, and a value and a determination method are not particularly limited. For example, the number of defects can be used as a reference value based on defect inhibitive performance and the like required for the liquid chemical.

[Liquid-Chemical-Accommodating Body]

The liquid chemical produced by the above-described purification method may be accommodated in a container to be stored therein until used.

Such a container, and a liquid chemical (or a resist composition) accommodated in the container are collectively referred to as a liquid-chemical-accommodating body. The liquid chemical is taken out from a stored-liquid-chemical-accommodating body and used.

As a container for storing the liquid chemical, a container, in which a degree of cleanliness of an inner side is high and elution of impurities occurs less, is preferable in consideration of a use application for manufacturing semiconductor devices.

Specific examples of usable containers include "CLEAN Bottle" series manufactured by AICELLO CORPORATION, "Pure Bottle" manufactured by KODAMA PLASTICS Co., Ltd., and the like, but examples are not limited thereto.

As the container, it is preferable to use a multi-layer bottle in which a container inner wall has a six-layer structure made of six kinds of resins, or a multi-layer bottle in which a container inner wall has a seven-layer structure made of seven kinds of resins for the purpose of preventing impurities from being mixed (contamination) into the liquid chemical. Examples of these containers include a container described in JP2015-123351A.

A liquid-contacting part of this container preferably consists of the above-described corrosion-resistant material, or glass. It is preferable that 90% or more of an area of the liquid-contacting part consists of the above-mentioned material, and it is more preferable that the entire liquid-contacting part consists of the above-mentioned material from the viewpoint that then, more excellent effects of the present invention are obtained.

EXAMPLES

Hereinafter, the present invention will be described in more detail based on examples. In the following examples, materials, amounts thereof used, ratios thereof, the details of treatments, treatment procedures, and the like can be suitably modified without departing from the scope of the present invention. Accordingly, the scope of the present invention should not be limitedly interpreted by the following examples.

In preparation of liquid chemicals of examples and comparative examples, handling of containers, preparation of liquid chemicals, filling, storage, and analytical measurement were all performed in a clean room having a cleanliness satisfying ISO class 2 or 1. In measurement of contents of organic impurities, and measurement of contents of metal atoms, in a case of measuring a liquid chemical below a detection limit in normal measurement, the measurement was performed after concentrating the liquid chemical to a detectable concentration (for example, the liquid chemical is concentrated to 1/100 in terms of volume), and a content thereof was calculated by converting the concentration to a concentration of a solution before performing the concentration to improve measurement accuracy.

[Purification of Liquid Chemical 1]

A liquid chemical was produced by performing filtration using the same purification device as that shown in FIG. 1 except that a purification target substance (a commercial product) containing cyclohexanone (CHN) as an organic solvent was prepared, four filter units were disposed in series along a pipe line, a filtration device not having an adjustment valve was used, and a pipe line, which can return a filtered purification target substance to a production tank after filtration by a filter unit at the most downstream side, was used. The following filters were disposed in the respective filter units from a primary side (in Table 1, the filters are respectively described as first to fourth filters).

Polypropylene filter (pore diameter: 200 nm, a porous film, described as "PP" in the table)

Polyfluorocarbon filter having an ion exchange group (pore diameter: 10 nm, a fiber film of a polymer of PTFE and PES (polyethylene sulfonic acid), described as "IEX" in the table)

Nylon filter (pore diameter: 5 nm, a fiber film, described as "Nylon" in the table)

UPE filter (pore diameter: 1 nm, a porous film, described as "UPE" in the table)

A purification target substance that had passed through the above four filter units was returned to the production tank. This operation was repeated five times (shown as "Number of circulations" in Table 1), and thereby a liquid chemical was obtained.

[Purification of Liquid Chemicals 2 to 33]

Liquid chemicals 2 to 33 were obtained by purifying a purification target substance containing an organic solvent shown in Table 1 under conditions shown in Table 1. The respective liquid chemicals were obtained as follows: a liquid of a purification target substance was passed through each of the filters shown in Table 1 from the first filter to the fifth filter in order (where a liquid chemical with a blank filter column indicates that the filter was not used, for example, in the case of the liquid chemical 2, a liquid passed through the first filter to the fourth filter); and this operation was repeated for the number of times shown in the section of "Number of circulations."

As purification target substances shown in Table 1, purification target substances respectively having different lots were obtained. Accordingly, components other than an organic solvent initially contained in the respective purification target substances may be different in some cases. Table 1 is divided into Table 1 (part 1) and Table 1 (part 2).

TABLE 1

| Table 1 (part 1) | Purification target substance Organic solvent | First filter | | Second filter | | Third filter | | Fourth filter | | Fifth filter | | Number of circulations |
|---|---|---|---|---|---|---|---|---|---|---|---|---|
| | | Material | Pore diameter (nm) | Material | Pore diameter (nm) | Material | Pore diameter (nm) | Material | Pore diameter (nm) | Material | Pore diameter (nm) | |
| Liquid chemical 1 | CHN | PP | 200 | IEX | 10 | Nylon | 5 | UPE | 1 | | | 5 |
| Liquid chemical 2 | CHN | PP | 200 | IEX | 10 | Nylon | 5 | UPE | 1 | | | 4 |

TABLE 1-continued

| Table 1 (part 1) | Purification target substance Organic solvent | First filter Material | First filter Pore diameter (nm) | Second filter Material | Second filter Pore diameter (nm) | Third filter Material | Third filter Pore diameter (nm) | Fourth filter Material | Fourth filter Pore diameter (nm) | Fifth filter Material | Fifth filter Pore diameter (nm) | Number of circulations |
|---|---|---|---|---|---|---|---|---|---|---|---|---|
| Liquid chemical 3 | CHN | PP | 200 | IEX | 10 | Nylon | 5 | UPE | 1 | | | 3 |
| Liquid chemical 4 | CHN | PP | 200 | IEX | 10 | Nylon | 5 | UPE | 1 | | | 2 |
| Liquid chemical 5 | CHN | PP | 200 | IEX | 10 | Nylon | 5 | UPE | 1 | | | 1 |
| Liquid chemical 6 | CHN | PP | 200 | IEX | 10 | Nylon | 5 | UPE | 3 | | | 5 |
| Liquid chemical 7 | CHN | PP | 200 | IEX | 10 | Nylon | 5 | UPE | 5 | | | 5 |
| Liquid chemical 8 | CHN | PTFE | 10 | PTFE | 10 | UPE | 5 | | | | | 1 |
| Liquid chemical 9 | CHN | PP | 200 | IEX | 10 | Nylon | 10 | UPE | 1 | | | 5 |
| Liquid chemical 10 | CHN | PP | 200 | IEX | 10 | Nylon | 20 | UPE | 1 | | | 5 |
| Liquid chemical 11 | CHN | PP | 200 | IEX | 20 | Nylon | 5 | UPE | 1 | | | 5 |
| Liquid chemical 12 | CHN | PP | 200 | IEX | 10 | Nylon | 5 | UPE | 1 | | | 10 |
| Liquid chemical 13 | CHN | PP | 200 | IEX | 10 | Nylon | 5 | UPE | 1 | | | 15 |
| Liquid chemical 14 | CHN | PP | 200 | IEX | 10 | Nylon | 5 | Nylon | 5 | | | 5 |
| Liquid chemical 15 | CHN | pp | 200 | IEX | 10 | UPE | 1 | UPE | 1 | | | 10 |
| Liquid chemical 16 | CHN | PP | 200 | IEX | 10 | PTFE | 5 | PTFE | 5 | | | 1 |

TABLE 2

| Table 1 (part 2) | Purification target substance Organic solvent | First filter Material | First filter Pore diameter (nm) | Second filter Material | Second filter Pore diameter (nm) | Third filter Material | Third filter Pore diameter (nm) | Fourth filter Material | Fourth filter Pore diameter (nm) | Fifth filter Material | Fifth filter Pore diameter (nm) | Number of circulations |
|---|---|---|---|---|---|---|---|---|---|---|---|---|
| Liquid chemical 17 | CHN | PP | 200 | IEX | 10 | IEX | 20 | Nylon | 5 | | | 5 |
| Liquid chemical 18 | CHN | IEX | 10 | IEX | 10 | IEX | 10 | IEX | 10 | Nylon | 5 | 5 |
| Liquid chemical 19 | CHN | PP | 200 | IEX | 10 | IEX | 10 | UPE | 5 | | | 5 |
| Liquid chemical 20 | CHN | PP | 200 | IEX | 10 | Nylon | 5 | UPE | 5 | UPE | 3 | 5 |
| Liquid chemical 21 | CHN | PP | 200 | IEX | 10 | Nylon | 5 | UPE | 5 | UPE | 1 | 5 |
| Liquid chemical 22 | CHN | PP | 200 | IEX | 10 | Nylon | 5 | UPE | 3 | UPE | 1 | 5 |
| Liquid chemical 23 | CHN | PP | 200 | IEX | 10 | Nylon | 5 | UPE | 1 | UPE | 1 | 5 |
| Liquid chemical 24 | PGMEA/PG-ME(7:3) | PP | 200 | IEX | 10 | Nylon | 5 | UPE | 1 | | | 5 |
| Liquid chemical 25 | nBA | PP | 200 | IEX | 10 | Nylon | 5 | UPE | 1 | | | 5 |
| Liquid chemical 26 | PC/PG-MEA(1:9) | PP | 200 | IEX | 10 | Nylon | 5 | UPE | 1 | | | 5 |
| Liquid chemical 27 | PGMEA | PP | 200 | IEX | 10 | Nylon | 5 | UPE | 1 | | | 5 |
| Liquid chemical 28 | EL | PP | 200 | IEX | 10 | Nylon | 5 | UPE | 1 | | | 5 |
| Liquid chemical 29 | iAA | PP | 200 | IEX | 10 | Nylon | 5 | UPE | 1 | | | 5 |
| Liquid chemical 30 | MIBC | PP | 200 | IEX | 10 | Nylon | 5 | UPE | 1 | | | 5 |
| Liquid chemical 31 | IPA | PP | 200 | IEX | 10 | Nylon | 5 | UPE | 1 | | | 5 |

TABLE 2-continued

| Table 1 (part 2) | Purification target substance Organic solvent | First filter Material | Pore diameter (nm) | Second filter Material | Pore diameter (nm) | Third filter Material | Pore diameter (nm) | Fourth filter Material | Pore diameter (nm) | Fifth filter Material | Pore diameter (nm) | Number of circulations |
|---|---|---|---|---|---|---|---|---|---|---|---|---|
| Liquid chemical 32 | CHN | PP | 200 | PTFE | 10 | | | | | | | 1 |
| Liquid chemical 33 | CHN | IEX | 10 | UPE | 1 | UPE | 1 | UPE | 1 | UPE | 1 | 20 |

Abbreviations in Table 1 respectively represent the following contents.

PGMEA/PGME (7:3): a mixed solution of PGMEA and PGME mixed at 7:3 (v/v)

NBA: n-butyl acetate

PC/PGMEA (1:9): a mixed solution of PC and PGMEA mixed at 1:9 (v/v)

EL: ethyl lactate

IAA: isoamyl acetate

MIBC: methyl isobutyl carbinol

IPA: isopropanol

PTFE: a polytetrafluoroethylene filter (porous film)

UPE: an ultra high molecular weight polyethylene filter (which is a porous film)

IEX: a polyfluorocarbon filter having an ion exchange group

Nylon: a nylon filter (which is a fiber film)

[Measurement of Number of Particles Contained which have Particle Size of 10 to 100 nm in Liquid Chemical]

The number of particles contained which have a particle size of 10 to 100 nm in the liquid chemical was measured by the following method. First, a predetermined amount of a liquid chemical was applied on a silicon substrate to form a substrate having a liquid chemical layer, and a surface of the substrate having a liquid chemical layer was scanned with laser light to detect scattering light. Thereby, a position and a particle size of a defect present on the surface of the substrate having a liquid chemical layer were specified. Next, based on the position of the defect, elemental analysis was performed by an EDX (energy dispersive X-ray) analysis method to examine a composition of the defect. By this method, the number of metal-containing particles on the substrate was obtained and converted into the number of particles contained per unit volume of the liquid chemical (particles/cm$^3$).

Furthermore, in the same manner, a composition of the metal-containing particles, an association state with a high-boiling point organic compound, and the like were also identified.

For analysis, a wafer inspection system "SP-5" manufactured by KLA-Tencor was used in combination with a fully automatic defect review and classification device "SEMVision G6" of Applied Materials, Inc. In addition, the presence or absence of a high-boiling point organic compound was measured by gas chromatography mass spectrometry.

Table 2 shows the measurement results for the respective liquid chemicals, a ratio of the number of particles contained which was calculated based on the measurement results, and the like.

TABLE 3

| | Composition of liquid chemical | | Configuration of metal-containing particles1 | | |
|---|---|---|---|---|---|
| Table 2 (part 1) | Organic solvent | The number of metal-containing particles contained (particles/cm$^3$) | Particles A (the number of particles %) | Particles E (the number of particles %) | Particles F (the number of particles %) |
| Liquid chemical 1 | CHN | $5.0 \times 10^8$ | 3 | 10 | 90 |
| Liquid chemical 2 | CHN | $1.6 \times 10^9$ | 2 | 13 | 87 |
| Liquid chemical 3 | CHN | $3.6 \times 10^{10}$ | 2 | 15 | 85 |
| Liquid chemical 4 | CHN | $1.0 \times 10^{11}$ | 2 | 14 | 86 |
| Liquid chemical 5 | CHN | $5.4 \times 10^{11}$ | 4 | 16 | 84 |
| Liquid chemical 6 | CHN | $2.0 \times 10^8$ | 2 | 12 | 88 |
| Liquid chemical 7 | CHN | $3.0 \times 10^8$ | 1 | 11 | 89 |
| Liquid chemical 8 | CHN | $2.7 \times 10^8$ | 52 | 12 | 88 |
| Liquid chemical 9 | CHN | $4.0 \times 10^8$ | 10 | 15 | 85 |
| Liquid chemical 10 | CHN | $2.0 \times 10^8$ | 7 | 14 | 86 |
| Liquid chemical 11 | CHN | $6.0 \times 10^8$ | 4 | 0.8 | 99.2 |
| Liquid chemical 12 | CHN | $8.0 \times 10^8$ | 2 | 99 | 1 |
| Liquid chemical 13 | CHN | $4.0 \times 10^8$ | 3 | 99.1 | 0.9 |
| Liquid chemical 14 | CHN | $1.0 \times 10^8$ | 1 | 11 | 89 |
| Liquid chemical 15 | CHN | $1.1 \times 10^{-2}$ | 2 | 11 | 89 |
| Liquid chemical 16 | CHN | $9.5 \times 10^{11}$ | 4 | 16 | 84 |
| Liquid chemical 17 | CHN | $5.0 \times 10^8$ | 2 | 15 | 85 |
| Liquid chemical 18 | CHN | $4.0 \times 10^8$ | 2 | 15 | 85 |
| Liquid chemical 19 | CHN | $5.0 \times 10^8$ | 2 | 14 | 86 |
| Liquid chemical 20 | CHN | $4.0 \times 10^8$ | 2 | 16 | 84 |
| Liquid chemical 21 | CHN | $3.0 \times 10^8$ | 3 | 15 | 85 |

TABLE 3-continued

| Table 2 (part 1) | Composition of liquid chemical | | Configuration of metal-containing particles1 | | |
|---|---|---|---|---|---|
| | Organic solvent | The number of metal-containing particles contained (particles/cm$^3$) | Particles A (the number of particles %) | Particles E (the number of particles %) | Particles F (the number of particles %) |
| Liquid chemical 22 | CHN | $5.0 \times 10^8$ | 2 | 13 | 87 |
| Liquid chemical 23 | CHN | $2.0 \times 10^8$ | 3 | 12 | 88 |
| Liquid chemical 24 | PGMEA/PGME (7:3) | $6.0 \times 10^8$ | 1 | 11 | 89 |
| Liquid chemical 25 | nBA | $5.0 \times 10^8$ | 2 | 15 | 85 |
| Liquid chemical 26 | PC/PGMEA (1:9) | $7.0 \times 10^8$ | 1 | 13 | 87 |
| Liquid chemical 27 | PGMEA | $7.0 \times 10^8$ | 1 | 13 | 87 |
| Liquid chemical 28 | EL | $8.1 \times 10^8$ | 2 | 14 | 86 |
| Liquid chemical 29 | iAA | $6.8 \times 10^8$ | 2 | 15 | 85 |
| Liquid chemical 30 | MIBC | $9.2 \times 10^8$ | 2 | 13 | 87 |
| Liquid chemical 31 | IPA | $7.6 \times 10^8$ | 1 | 14 | 86 |
| Liquid chemical 32 | CHN | $1.1 \times 10^{12}$ | 4 | 18 | 82 |
| Liquid chemical 33 | CHN | $9.0 \times 10^{-3}$ | 1 | 16 | 84 |

TABLE 4

| Table 2 (part 2) | Configuration 1 of metal containing particles | | | | | | |
|---|---|---|---|---|---|---|---|
| | Total (B + C) (the number of particles %) | Particles B (the number of particles %) | Particles C (the number of particles %) | B/C | A/(B + C) | E/F | High-boiling point organic compound |
| Liquid chemical 1 | 97 | 23 | 77 | $3.3 \times 10^0$ | $3.1 \times 10^{-2}$ | $1.1 \times 10^{-1}$ | Contained |
| Liquid chemical 2 | 98 | 26 | 74 | $2.8 \times 10^0$ | $2.0 \times 10^{-2}$ | $1.5 \times 10^{-1}$ | Contained |
| Liquid chemical 3 | 98 | 24 | 76 | $3.2 \times 10^0$ | $2.0 \times 10^{-2}$ | $1.8 \times 10^{-1}$ | Contained |
| Liquid chemical 4 | 98 | 28 | 72 | $2.6 \times 10^0$ | $2.0 \times 10^{-2}$ | $1.6 \times 10^{-1}$ | Contained |
| Liquid chemical 5 | 96 | 31 | 69 | $2.2 \times 10^0$ | $4.2 \times 10^{-2}$ | $1.9 \times 10^{-1}$ | Contained |
| Liquid chemical 6 | 98 | 58 | 42 | $7.2 \times 10^{-1}$ | $2.0 \times 10^{-2}$ | $1.4 \times 10^{-1}$ | Contained |
| Liquid chemical 7 | 99 | 49 | 51 | $1.0 \times 10^0$ | $1.0 \times 10^{-2}$ | $1.2 \times 10^{-1}$ | Contained |
| Liquid chemical 8 | 48 | 21 | 79 | $3.8 \times 10^0$ | $1.1 \times 10^0$ | $1.4 \times 10^{-1}$ | Contained |
| Liquid chemical 9 | 90 | 27 | 73 | $2.7 \times 10^0$ | $1.1 \times 10^{-1}$ | $1.8 \times 10^{-1}$ | Contained |
| Liquid chemical 10 | 93 | 20 | 80 | $4.0 \times 10^0$ | $7.5 \times 10^{-2}$ | $1.6 \times 10^{-1}$ | Contained |
| Liquid chemical 11 | 96 | 27 | 73 | $2.7 \times 10^0$ | $4.2 \times 10^{-2}$ | $8.1 \times 10^{-3}$ | Contained |
| Liquid chemical 12 | 98 | 20 | 80 | $4.0 \times 10^0$ | $2.0 \times 10^{-2}$ | $9.9 \times 10^1$ | Contained |
| Liquid chemical 13 | 97 | 27 | 73 | $2.7 \times 10^0$ | $3.1 \times 10^{-2}$ | $1.1 \times 10^2$ | Contained |
| Liquid chemical 14 | 99 | 23 | 77 | $3.3 \times 10^0$ | $1.0 \times 10^{-2}$ | $1.2 \times 10^{-1}$ | Contained |
| Liquid chemical 15 | 98 | 23 | 77 | $3.3 \times 10^0$ | $2.0 \times 10^{-2}$ | $1.2 \times 10^{-1}$ | Contained |
| Liquid chemical 16 | 96 | 31 | 69 | $2.2 \times 10^0$ | $4.2 \times 10^{-2}$ | $1.9 \times 10^{-1}$ | Contained |
| Liquid chemical 17 | 98 | 22 | 78 | $3.5 \times 10^0$ | $2.0 \times 10^{-2}$ | $1.8 \times 10^{-1}$ | Contained |
| Liquid chemical 18 | 98 | 28 | 72 | $2.6 \times 10^0$ | $2.0 \times 10^{-2}$ | $1.8 \times 10^{-1}$ | Contained |
| Liquid chemical 19 | 98 | 26 | 74 | $2.8 \times 10^0$ | $2.0 \times 10^{-2}$ | $1.6 \times 10^{-1}$ | Contained |
| Liquid chemical 20 | 98 | 24 | 76 | $3.2 \times 10^0$ | $2.0 \times 10^{-2}$ | $1.9 \times 10^{-1}$ | Contained |
| Liquid chemical 21 | 97 | 25 | 75 | $3.0 \times 10^0$ | $3.1 \times 10^{-2}$ | $1.8 \times 10^{-1}$ | Contained |
| Liquid chemical 22 | 98 | 23 | 77 | $3.3 \times 10^0$ | $2.0 \times 10^{-2}$ | $1.5 \times 10^{-1}$ | Contained |

TABLE 4-continued

| Table 2 (part 2) | Configuration 1 of metal containing particles | | | | | | High-boiling point organic compound |
|---|---|---|---|---|---|---|---|
| | Total (B + C) (the number of particles %) | Particles B (the number of particles %) | Particles C (the number of particles %) | B/C | A/(B + C) | E/F | |
| Liquid chemical 23 | 97 | 22 | 78 | $3.5 \times 10^0$ | $3.1 \times 10^{-2}$ | $1.4 \times 10^{-1}$ | Contained |
| Liquid chemical 24 | 99 | 26 | 74 | $2.8 \times 10^0$ | $1.0 \times 10^{-2}$ | $1.2 \times 10^{-1}$ | Contained |
| Liquid chemical 25 | 98 | 28 | 72 | $2.6 \times 10^0$ | $2.0 \times 10^{-2}$ | $1.8 \times 10^{-1}$ | Contained |
| Liquid chemical 26 | 99 | 21 | 79 | $3.8 \times 10^0$ | $1.0 \times 10^{-2}$ | $1.5 \times 10^{-1}$ | Contained |
| Liquid chemical 27 | 99 | 21 | 79 | $3.8 \times 10^0$ | $1.0 \times 10^{-2}$ | $1.5 \times 10^{-1}$ | Contained |
| Liquid chemical 28 | 98 | 20 | 80 | $4.0 \times 10^0$ | $2.0 \times 10^{-2}$ | $1.6 \times 10^{-1}$ | Contained |
| Liquid chemical 29 | 98 | 19 | 81 | $4.3 \times 10^0$ | $2.0 \times 10^{-2}$ | $1.8 \times 10^{-1}$ | Contained |
| Liquid chemical 30 | 98 | 18 | 82 | $4.6 \times 10^0$ | $2.0 \times 10^{-2}$ | $1.5 \times 10^{-1}$ | Contained |
| Liquid chemical 31 | 99 | 22 | 78 | $3.5 \times 10^0$ | $1.0 \times 10^{-2}$ | $1.6 \times 10^{-1}$ | Contained |
| Liquid chemical 32 | 96 | 23 | 77 | $3.3 \times 10^0$ | $4.2 \times 10^{-2}$ | $2.2 \times 10^{-1}$ | Contained |
| Liquid chemical 33 | 99 | 24 | 76 | $3.2 \times 10^0$ | $1.0 \times 10^{-2}$ | $1.9 \times 10^{-1}$ | Contained |

TABLE 5

| Table 2 (Part 3) | Configuration 2 of metal-containing particles | | | | | | |
|---|---|---|---|---|---|---|---|
| | Particles U (the number of particles %) | The number of particles (particles/cm³) | Particles V (the number of particles %) | U/V | The number of Pb-containing particles (particles/cm³) | The number of Ti-containing particles (particles/cm³) | Pb/Ti |
| Liquid chemical 1 | 95 | $4.8 \times 10^8$ | 5 | $1.9 \times 10^1$ | $5.0 \times 10^6$ | $6.0 \times 10^6$ | $8.3 \times 10^{-1}$ |
| Liquid chemical 2 | 93 | $1.5 \times 10^9$ | 7 | $1.3 \times 10^1$ | $1.3 \times 10^7$ | $1.9 \times 10^7$ | $6.8 \times 10^{-1}$ |
| Liquid chemical 3 | 95 | $3.4 \times 10^{10}$ | 5 | $1.9 \times 10^1$ | $1.8 \times 10^8$ | $2.3 \times 10^8$ | $7.8 \times 10^{-1}$ |
| Liquid chemical 4 | 90 | $9.0 \times 10^{10}$ | 10 | $9.0 \times 10^0$ | $9.6 \times 10^8$ | $1.4 \times 10^9$ | $6.9 \times 10^{-1}$ |
| Liquid chemical 5 | 91 | $4.9 \times 10^{11}$ | 9 | $1.0 \times 10^1$ | $8.1 \times 10^9$ | $9.6 \times 10^9$ | $8.4 \times 10^{-1}$ |
| Liquid chemical 6 | 95 | $1.9 \times 10^8$ | 5 | $1.9 \times 10^1$ | $2.0 \times 10^6$ | $2.4 \times 10^6$ | $8.3 \times 10^{-1}$ |
| Liquid chemical 7 | 95 | $2.9 \times 10^8$ | 5 | $1.9 \times 10^1$ | $2.5 \times 10^6$ | $3.6 \times 10^6$ | $6.9 \times 10^{-1}$ |
| Liquid chemical 8 | 92 | $2.5 \times 10^8$ | 8 | $1.2 \times 10^1$ | $2.4 \times 10^6$ | $3.6 \times 10^6$ | $6.7 \times 10^{-1}$ |
| Liquid chemical 9 | 95 | $3.8 \times 10^8$ | 5 | $1.9 \times 10^1$ | $3.8 \times 10^6$ | $4.8 \times 10^6$ | $7.9 \times 10^{-1}$ |
| Liquid chemical 10 | 95 | $1.9 \times 10^8$ | 5 | $1.9 \times 10^1$ | $3.7 \times 10^6$ | $2.4 \times 10^6$ | $1.5 \times 10^0$ |
| Liquid chemical 11 | 96 | $5.8 \times 10^8$ | 4 | $2.4 \times 10^1$ | $5.0 \times 10^6$ | $7.2 \times 10^6$ | $6.9 \times 10^{-1}$ |
| Liquid chemical 12 | 96 | $7.7 \times 10^8$ | 4 | $2.4 \times 10^1$ | $6.5 \times 10^6$ | $9.6 \times 10^6$ | $6.8 \times 10^{-1}$ |
| Liquid chemical 13 | 93 | $3.7 \times 10^8$ | 7 | $1.3 \times 10^1$ | $3.5 \times 10^6$ | $4.8 \times 10^6$ | $7.3 \times 10^{-1}$ |
| Liquid chemical 14 | 91 | $9.1 \times 10^7$ | 9 | $1.0 \times 10^1$ | $1.0 \times 10^6$ | $1.2 \times 10^6$ | $8.3 \times 10^{-1}$ |
| Liquid chemical 15 | 91 | $1.0 \times 10^{-2}$ | 9 | $1.0 \times 10^1$ | $1.0 \times 10^{-3}$ | $1.1 \times 10^{-3}$ | $9.1 \times 10^{-1}$ |
| Liquid chemical 16 | 97 | $9.2 \times 10^{11}$ | 3 | $3.2 \times 10^1$ | $7.9 \times 10^9$ | $9.9 \times 10^9$ | $8.0 \times 10^{-1}$ |
| Liquid chemical 17 | 93 | $4.7 \times 10^8$ | 7 | $1.3 \times 10^1$ | $3.7 \times 10^7$ | $1.2 \times 10^7$ | $3.1 \times 10^0$ |

TABLE 5-continued

| | Configuration 2 of metal-containing particles | | | | | | |
|---|---|---|---|---|---|---|---|
| Table 2 (Part 3) | Particles U (the number of particles %) | The number of particles (particles/cm$^3$) | Particles V (the number of particles %) | U/V | The number of Pb-containing particles (particles/cm$^3$) | The number of Ti-containing particles (particles/cm$^3$) | Pb/Ti |
| Liquid chemical 18 | 91 | $3.6 \times 10^8$ | 9 | $1.0 \times 10^1$ | $1.8 \times 10^3$ | $2.0 \times 10^8$ | $9.0 \times 10^{-6}$ |
| Liquid chemical 19 | 90 | $4.5 \times 10^8$ | 10 | $9.0 \times 10^0$ | $9.0 \times 10^7$ | $9.5 \times 10^7$ | $9.5 \times 10^{-1}$ |
| Liquid chemical 20 | 95 | $3.8 \times 10^8$ | 5 | $1.9 \times 10^1$ | $6.2 \times 10^6$ | $5.0 \times 10^7$ | $1.2 \times 10^{-1}$ |
| Liquid chemical 21 | 94 | $2.8 \times 10^8$ | 6 | $1.6 \times 10^1$ | $2.4 \times 10^6$ | $1.3 \times 10^8$ | $1.8 \times 10^{-2}$ |
| Liquid chemical 22 | 96 | $4.8 \times 10^8$ | 4 | $2.4 \times 10^1$ | $4.4 \times 10^5$ | $4.5 \times 10^8$ | $9.8 \times 10^{-4}$ |
| Liquid chemical 23 | 93 | $1.9 \times 10^8$ | 7 | $1.3 \times 10^1$ | $1.0 \times 10^4$ | $1.3 \times 10^8$ | $7.7 \times 10^{-5}$ |
| Liquid chemical 24 | 91 | $5.5 \times 10^8$ | 9 | $1.0 \times 10^1$ | $5.1 \times 10^6$ | $7.2 \times 10^6$ | $7.1 \times 10^{-1}$ |
| Liquid chemical 25 | 91 | $4.6 \times 10^8$ | 9 | $1.0 \times 10^1$ | $53 \times 10^6$ | $6.0 \times 10^6$ | $8.8 \times 10^{-1}$ |
| Liquid chemical 26 | 93 | $6.5 \times 10^8$ | 7 | $1.3 \times 10^1$ | $4.1 \times 10^6$ | $8.4 \times 10^6$ | $4.9 \times 10^{-1}$ |
| Liquid chemical 27 | 93 | $6.5 \times 10^8$ | 7 | $1.3 \times 10^1$ | $4.1 \times 10^6$ | $8.9 \times 10^6$ | $4.6 \times 10^{-1}$ |
| Liquid chemical 28 | 92 | $7.5 \times 10^8$ | 8 | $1.2 \times 10^1$ | $5.0 \times 10^6$ | $8.1 \times 10^6$ | $6.2 \times 10^{-1}$ |
| Liquid chemical 29 | 91 | $6.2 \times 10^8$ | 9 | $1.0 \times 10^1$ | $3.9 \times 10^6$ | $8.0 \times 10^6$ | $4.9 \times 10^{-1}$ |
| Liquid chemical 30 | 94 | $8.7 \times 10^8$ | 6 | $1.6 \times 10^1$ | $4.0 \times 10^6$ | $7.5 \times 10^6$ | $5.3 \times 10^{-1}$ |
| Liquid chemical 31 | 94 | $7.1 \times 10^8$ | 6 | $1.6 \times 10^1$ | $5.2 \times 10^6$ | $8.8 \times 10^6$ | $5.9 \times 10^{-1}$ |
| Liquid chemical 32 | 95 | $1.1 \times 10^{12}$ | 5 | $1.9 \times 10^1$ | $8.6 \times 10^9$ | $1.4 \times 10^{10}$ | $6.1 \times 10^{-1}$ |
| Liquid chemical 33 | 96 | $8.6 \times 10^{-3}$ | 4 | $2.4 \times 10^1$ | $1.0 \times 10^{-4}$ | $9.0 \times 10^{-4}$ | $1.1 \times 10^{-1}$ |

Table 2 is divided into three tables of Table 2 (part 1) to Table 2 (part 3), and composition and the like of the respective liquid chemicals are described over the corresponding row of Table 2 (part 1) to Table 2 (part 3).

For example, regarding the liquid chemical 1, the liquid chemical 1 contains cyclohexanone (CHN) as an organic solvent, and the number of metal-containing particles per unit volume of the liquid chemical (the number of particles contained) is $5.0 \times 10^8$ particles/cm$^3$. As a classification of metal-containing particles (corresponding to "Configuration 1 of metal-containing particles"), particles A are contained at 3% by number of particles, particles B are contained at 23% by number of particles, and particles C are contained at 77% by number of particles in 100% by number of metal-containing particles. In addition, among the particles, in a case of defining the number of the particles A as 100% by number of particles, particles E are contained at 10% by number of particles, and particles F are contained at 90% by number of particles. B/C was $3.3 \times 10^0$, A/(B+C) was $3.1 \times 10^{-2}$, and E/F was $1.1 \times 10^{-1}$. Furthermore, the liquid chemical 1 contained a high-boiling point organic compound. Furthermore, as a classification of metal-containing particles in another form (corresponding to "Configuration 2 of metal-containing particles"), particles U are contained at 95% by number of particles ($4.8 \times 10^8$ particles in terms of the number of particles), and particles V are contained at 5% by number of particles in 100% by number of metal-containing particles; and U/N was $1.9 \times 10^1$. Furthermore, in the liquid chemical 1, the number of Pb-containing particles was $5.0 \times 10^6$ particles/cm$^3$, the number of Ti-containing particles was $6.0 \times 10^6$ particles/cm$^3$, and Pb/Ti was $8.3 \times 10^{-1}$.

Other liquid chemicals were also measured in the same manner as above.

Example 1

Defect inhibitive performance was evaluated using the above-prepared liquid chemical 1 as a pre-wetting solution. Resist compositions used are as follows.

[Resist Composition]

A resist composition was obtained by mixing each component at the following composition.

Acid-decomposable resin (resin represented by the formula below (weight-average molecular weight (Mw) of 7500): numerical values described for each repeating unit means mol %): 100 parts by mass

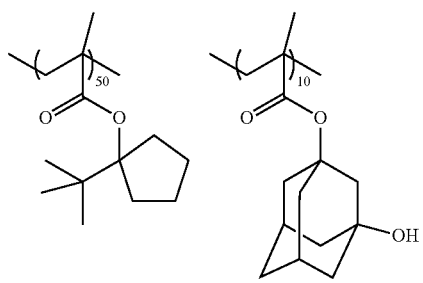

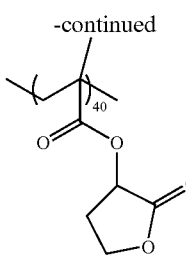

Photo-acid generator shown below: 8 parts by mass

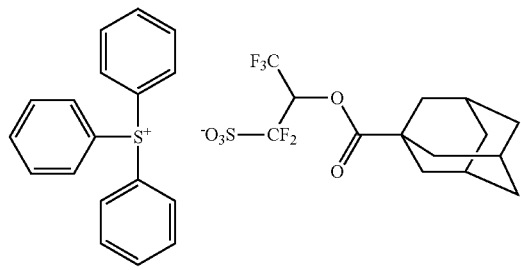

Quencher shown below: 5 parts by mass (a mass ratio was 0.1:0.3:0.3:0.2 in order from the left). Among the following quenchers, a quencher of a polymer type has a weight-average molecular weight (Mw) of 5,000. In addition, numerical values described for each repeating unit means a molar ratio.

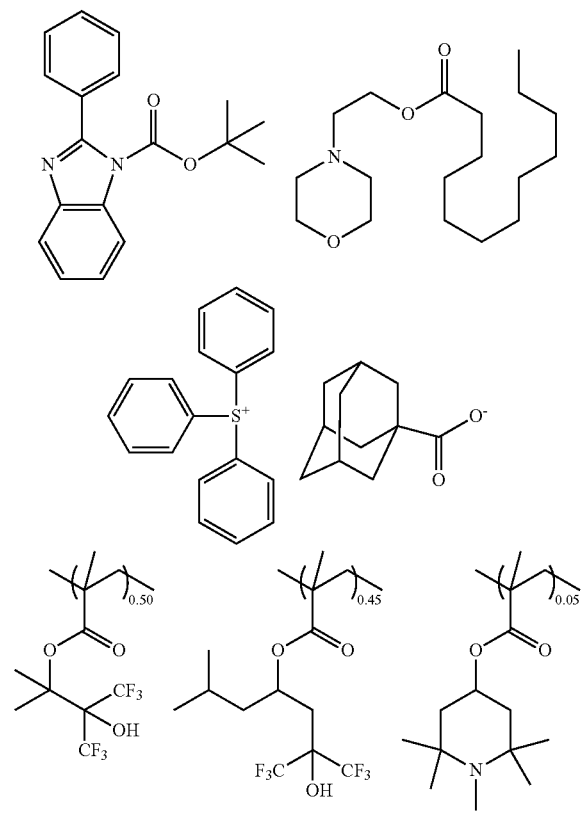

Hydrophobic resin shown below: 4 parts by mass (mass ratio was 0.5:0.5 in order from the left). Among the following hydrophobic resins, the hydrophobic resin on the left has a weight-average molecular weight (Mw) of 7,000, and the hydrophobic resin on the right has a weight-average molecular weight (Mw) of 8,000. In the respective hydrophobic resins, numerical values described for each repeating unit means a molar ratio.

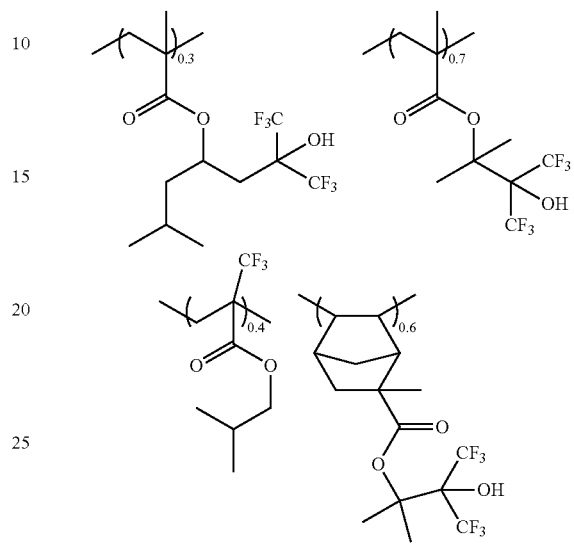

Solvent:
  PGMEA (propylene glycol monomethyl ether acetate): 3 parts by mass
  Cyclohexanone: 600 parts by mass
  γ-BL (γ-butyrolactone): 100 parts by mass (Residue Defect Inhibitive Performance and Bridge Defect Inhibitive Performance)

The residue defect inhibitive performance and bridge defect inhibitive performance of the liquid chemical were evaluated by the following method. Using a spin coater "ACT-8" manufactured by Tokyo Electron, a hexamethyldisilazane-treated 8-inch Si substrate (manufactured by Advanced Materials Technology (hereinafter, also referred to as a "substrate")), on which an antireflection layer was not provided, was pre-wetted with the liquid chemical 1. Next, the resist composition was added dropwise while the substrate was stationary. After dropwise addition, the substrate was rotated while maintaining a rotation speed at 500 rpm for 3 seconds, thereafter, maintaining a rotation speed at 100 rpm for 2 seconds, and then maintaining a rotation speed at 500 rpm for 3 seconds, and then again maintaining a rotation speed at 100 rpm for 2 seconds. Thereafter, the rotation speed was increased and maintained for 60 seconds. Thereafter, the film was dried by heating on a hot plate at 150° C. for 90 seconds to form a resist film having a thickness of 9 µm.

Pattern exposure was performed for this resist film under exposure conditions of NA=0.60 and σ=0.75 using a mask having a line and space pattern such that a line width of a pattern formed after reduction projection exposure and development becomes 60 nm, and a space width becomes 60 nm, and using a KrF excimer laser scanner (manufactured by ASML, PAS 5500/850C, wavelength 248 nm). After the irradiation, the resist pattern was baked at 120° C. for 60 seconds, and then developed and rinsed, and baked at 110° C. for 60 seconds to form a resist pattern having a line width of 60 nm and a space width of 60 nm.

An image of the above resist pattern was obtained, and the number of residues in an unexposed part per unit area and the number of bridge-like defects between patterns were measured. The results were evaluated according to the following standard and are shown in Table 4. In the following evaluation standard, "the number of defects" indicates each of the number of residue defects and the number of bridge defects.

AA: The number of defects was less than 30.
A: The number of defects was 30 or more and less than 60.
B: The number of defects was 60 or more and less than 90.
C: The number of defects was 90 or more and less than 120.
D: The number of defects was 120 or more and less than 150.
E: The number of defects was 150 or more and less than 180.
F: The number of defects was 180 or more.

(Pattern Width Uniform Performance)

The pattern was observed using a scanning electron microscope (SEM) (CG-4100, manufactured by Hitachi High-Technologies Corporation) to determine Line Width Roughness (LWR). That is, in a case of observing patterns from the top, a distance from the center to an edge of a pattern was observed at an arbitrary point, and measurement variation was evaluated by 3σ. The results were evaluated according to the following standard to evaluate pattern width uniform performance. The results are shown in Table 4.

AA: 3σ was less than 1 nm.
A: 3σ was 1 nm or more and less than 3 nm.
B: 3σ was 3 nm or more and less than 5 nm.
C: 3σ was 5 nm or more and less than 8 nm.
D: 3σ was 8 nm or more and less than 10 nm.
E: 3σ was 10 nm or more and less than 12 nm.
F: 3σ was 12 nm or more.

Examples 2 to 23 and Examples 25 to 31

Residue defect inhibitive performance, bridge defect inhibitive performance, and pattern width uniform performance of each of liquid chemicals were evaluated in the same manner as above except that liquid chemicals 2 to 23 and liquid chemicals 25 to 31 were used instead of the liquid chemical 1. The results are shown in Table 4.

Comparative Examples 1 and 2

Residue defect inhibitive performance, bridge defect inhibitive performance, and pattern width uniform performance of each of the liquid chemicals 32 and 33 were evaluated in the same manner as above except that liquid chemicals 32 and 33 were used instead of the liquid chemical 1. The results are shown in Table 4.

Example 24

Residue defect inhibitive performance, bridge defect inhibitive performance, and pattern width uniform performance of a liquid chemical 24 were evaluated in the same manner as above except that the pre-wetting solution was not used, and the liquid chemical 24 was used as a developer. The results are shown in Table 4.

Example 32

A resist composition 2 as a liquid chemical was obtained using the same method and components as those of the resist composition 1 except that 3 parts by mass of PGMEA purified by the purification method for the liquid chemical 1 described in Example 1, 600 parts by mass of cyclohexanone purified by the purification method for the liquid chemical 1 described in Example 1, and 100 parts by mass of γ-BL (γ-butyrolactone) purified by the purification method for the liquid chemical 1 described in Example 1 were used instead of 3 parts by mass of PGMEA (propylene glycol monomethyl ether acetate), 600 parts by mass of cyclohexanone, and 100 parts by mass of γ-BL (γ-butyrolactone) in the resist composition 1.

Next, regarding the resist composition 2, the number of the metal-containing particles in the liquid chemical was evaluated by the same method as described above, and the number thereof was the same as that of the liquid chemical 1.

In addition, a pattern was formed by the same method as in Example 1 except that the resist composition 2 was used, and the pre-wetting solution was not used. In a case where residue defect inhibitive performance, bridge defect inhibitive performance, and pattern width uniform performance were examined, the results were the same as those in Example 1.

TABLE 6

| Table 4 | Liquid chemical used | Residue defect inhibitive performance | Bridge defect inhibitive performance | Pattern width uniform performance |
| --- | --- | --- | --- | --- |
| Example 1 | Liquid chemical 1 | AA | AA | AA |
| Example 2 | Liquid chemical 2 | AA | AA | A |
| Example 3 | Liquid chemical 3 | A | AA | A |
| Example 4 | Liquid chemical 4 | A | A | A |
| Example 5 | Liquid chemical 5 | B | A | B |
| Example 6 | Liquid chemical 6 | A | C | A |
| Example 7 | Liquid chemical 7 | A | B | A |
| Example 8 | Liquid chemical 8 | D | A | A |
| Example 9 | Liquid chemical 9 | C | A | A |
| Example 10 | Liquid chemical 10 | A | C | A |
| Example 11 | Liquid chemical 11 | A | C | A |
| Example 12 | Liquid chemical 12 | A | D | A |
| Example 13 | Liquid chemical 13 | A | E | A |
| Example 14 | Liquid chemical 14 | A | A | A |
| Example 15 | Liquid chemical 15 | B | A | A |
| Example 16 | Liquid chemical 16 | C | C | E |
| Example 17 | Liquid chemical 17 | A | C | A |
| Example 18 | Liquid chemical 18 | B | E | B |
| Example 19 | Liquid chemical 19 | B | A | A |
| Example 20 | Liquid chemical 20 | A | B | A |
| Example 21 | Liquid chemical 21 | A | C | A |
| Example 22 | Liquid chemical 22 | A | D | A |
| Example 23 | Liquid chemical 23 | A | E | A |
| Example 24 | Liquid chemical 24 | AA | AA | AA |
| Example 25 | Liquid chemical 25 | AA | AA | AA |
| Example 26 | Liquid chemical 26 | AA | AA | AA |
| Example 27 | Liquid chemical 27 | AA | AA | AA |
| Example 28 | Liquid chemical 28 | AA | AA | AA |
| Example 29 | Liquid chemical 29 | AA | AA | AA |
| Example 30 | Liquid chemical 30 | AA | AA | AA |
| Example 31 | Liquid chemical 31 | AA | AA | AA |
| Comparative Example 1 | Liquid chemical 32 | F | F | F |
| Comparative Example 2 | Liquid chemical 33 | F | F | F |

Based on the results of Examples 1 to 23 and Examples 25 to 31 in Table 4, it was found that excellent defect inhibitive performance was obtained in a case of using the liquid chemical of the embodiment of the present invention as a pre-wetting solution. In addition, based on the results of Example 24, it was found that excellent defect inhibitive performance was obtained in a case of using the liquid chemical of the embodiment of the present invention as a developer. Furthermore, based on the results of Example 32, it was found that excellent defect inhibitive performance was obtained in a case of using the liquid chemical of the embodiment of the present invention as a resist solution.

Furthermore, it was found that the liquid chemical 1 in which CB was 1.0 or more exhibited more excellent defect inhibitive performance (particularly, bridge defect inhibitive performance) as compared to that of the liquid chemical 6.

Furthermore, it was found that the liquid chemical 1 in which A/(B+C) was less than 1.0 exhibited more excellent defect inhibitive performance (particularly, residue defect inhibitive performance) as compared to that of the liquid chemical 8.

Furthermore, it was found that the liquid chemical 1 in which A/(B+C) was 0.1 or less exhibited more excellent defect inhibitive performance (particularly, residue defect inhibitive performance) as compared to that of the liquid chemical 9.

Furthermore, it was found that the liquid chemical 1 in which E/F was $1.0 \times 10^{-2}$ or more exhibited more excellent defect inhibitive performance (particularly, bridge defect inhibitive performance) as compared to that of the liquid chemical 11.

Furthermore, it was found that the liquid chemical 1 in which E/F was $1.0 \times 10^{2}$ or less exhibited more excellent defect inhibitive performance (particularly, bridge defect inhibitive performance) as compared to that of the liquid chemical 13.

Furthermore, it was found that the liquid chemical 1 in which UN was more than 10 exhibited more excellent defect inhibitive performance as compared to that of the liquid chemical 4.

Furthermore, the liquid chemical 1 in which the number of the particles U contained was $5.0 \times 10^{-2}$ particles/cm$^3$ or more exhibited more excellent defect inhibitive performance (particularly, residue defect inhibitive performance) as compared to that of the liquid chemical 15.

Furthermore, the liquid chemical 1 in which the number of the particles U contained was $1.0 \times 10^{11}$ particles/cm$^3$ or less exhibited more excellent defect inhibitive performance (particularly, pattern width uniform performance) as compared to that of the liquid chemical 16.

Furthermore, the liquid chemical 1 in which Pb/Ti was $1.0 \times 10^{-5}$ or more exhibited more excellent defect inhibitive performance (particularly, bridge defect inhibitive performance) as compared to that of the liquid chemical 18.

Furthermore, the liquid chemical 1 in which Pb/Ti was 1.0 or less exhibited more excellent defect inhibitive performance (particularly, bridge defect inhibitive performance) as compared to that of the liquid chemical 17.

EXPLANATION OF REFERENCES

10: purification device
11: production tank
12(a), 12(b): filter unit
13: filling device
14: pipe line
15(a): adjustment valve
16: filtration device

What is claimed is:

1. A liquid chemical comprising:
   an organic solvent;
   metal-containing particles containing a metal atom and having a particle size of 10 to 100 nm, and
   an organic compound having a boiling point of 300° C. or higher,
   wherein the number of the metal-containing particles contained is $1.0 \times 10^8$ to $1.0 \times 10^{11}$ particles/cm$^3$, and
   the organic solvent is at least one selected from the group consisting of propylene glycol monomethyl ether, propylene glycol monoethyl ether (PGME), propylene glycol monopropyl ether, propylene glycol monomethyl ether acetate (PGMEA), ethyl lactate (EL), methyl methoxypropionate, cyclopentanone, cyclohexanone (CHN), γ-butyrolactone, diisoamyl ether, butyl acetate (nBA), isoamyl acetate, dimethyl sulfoxide, N-methyl-2-pyrrolidone, ethylene carbonate, propylene carbonate (PC), sulfolane, cycloheptanone, decane, and 2-heptanone.

2. The liquid chemical according to claim 1, which is used for manufacturing a semiconductor device.

3. The liquid chemical according to claim 2,
   wherein the metal-containing particles consist of at least one selected from the group consisting of particles A consisting of a simple substance of the metal atom, particles B consisting of an oxide of the metal atom, and particles C consisting of a simple substance of the metal atom and an oxide of the metal atom.

4. The liquid chemical according to claim 1,
   wherein the metal-containing particles consist of at least one selected from the group consisting of particles A consisting of a simple substance of the metal atom, particles B consisting of an oxide of the metal atom, and particles C consisting of a simple substance of the metal atom and an oxide of the metal atom.

5. The liquid chemical according to claim 4,
   wherein the particles C have a simple substance of the metal atom and have an oxide of the metal atom which is disposed to cover at least a part of a surface of the simple substance of the metal atom.

6. The liquid chemical according to claim 4,
   wherein a ratio of the number of the particles C contained to the number of the particles B contained is 1.0 or more, based on the number of the particles per unit volume of the liquid chemical.

7. The liquid chemical according to claim 4,
   wherein a ratio of the number of the particles A contained to a total of the number of the particles B contained and the number of the particles C contained is less than 1.0, based on the number of the particles per unit volume of the liquid chemical.

8. The liquid chemical according to claim 4,
   wherein a ratio of the number of the particles A contained to a total of the number of the particles B contained and the number of the particles C contained is $1.0 \times 10^{-1}$ or less, based on the number of the particles per unit volume of the liquid chemical.

9. The liquid chemical according to claim 4,
   wherein the particles A consist of particles E consisting of one kind of the metal atom, and particles F consisting of two or more kinds of metal atoms, and
   a ratio of the number of the particles E contained to the number of the particles F contained is $1.0 \times 10^{-2}$ to $1.0 \times 10^{2}$, based on the number of the particles per unit volume of the liquid chemical.

10. The liquid chemical according to claim 1,
    wherein at least some of the metal-containing particles are particles U containing the organic compound.

11. The liquid chemical according to claim 10, wherein the number of the particles U contained per unit volume of the liquid chemical is $5.0 \times 10^{-2}$ to $1.0 \times 10^{11}$ particles/cm$^3$.

12. The liquid chemical according to claim 1, wherein at least some of the metal-containing particles are the particles U containing the organic compound and particles V not containing the organic compound, and a ratio of the number of the particles U contained to the number of the particles V contained is $1.0 \times 10^1$ or more, based on the number of the particles per unit volume of the liquid chemical.

13. The liquid chemical according to claim 1, wherein at least some of the metal-containing particles are at least one selected from the group consisting of Pb-containing particles containing a Pb atom and Ti-containing particles containing a Ti atom.

14. The liquid chemical according to claim 1, wherein at least some of the metal-containing particles are Pb-containing particles containing a Pb atom and Ti-containing particles containing a Ti atom, and a ratio of the number of the Pb-containing particles contained to the number of the Ti-containing particles contained is $1.0 \times 10^{-5}$ to 1.0, based on the number of the particles per unit volume of the liquid chemical.

15. A method for producing a liquid chemical, which is for producing the liquid chemical according to claim 1, the method comprising:

a filtration step of filtering a purification target substance containing the organic solvent using a filter to obtain the liquid chemical.

16. The method for producing a liquid chemical according to claim 15, the method further comprising:

a distillation step of distilling the purification target substance to obtain a distilled purification target substance prior to the filtration step, wherein the purification target substance contains the organic compound having a boiling point of 300° C. or higher, and a content of the organic compound in the distilled purification target substance is $1.0 \times 10^{-3}$ mass ppt to $1.0 \times 10^3$ mass ppm.

17. The method for producing a liquid chemical according to claim 15, wherein the filter comprises two or more kinds of filters, and the filtration step is a multi-stage filtration step in which the purification target substance is passed through the two or more kinds of filters different in at least one selected from the group consisting of a filter material, a pore diameter, and a pore structure.

18. The method for producing a liquid chemical according to claim 15, wherein, for the filter, when using one filter, a pore diameter of the filter is 5 nm or smaller, and when using two or more filters, a pore diameter of the filter having a smallest pore diameter among the filters is 5 nm or smaller.

* * * * *